United States Patent
Yasunami et al.

(10) Patent No.: US 7,432,034 B2
(45) Date of Patent: Oct. 7, 2008

(54) NEGATIVE RESIST COMPOSITION

(75) Inventors: Shoichiro Yasunami, Shizuoka (JP); Koji Shirakawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/642,291

(22) Filed: Aug. 18, 2003

(65) Prior Publication Data
US 2004/0033441 A1 Feb. 19, 2004

(30) Foreign Application Priority Data
Aug. 19, 2002 (JP) .................... P. 2002-238157

(51) Int. Cl.
G03F 7/004 (2006.01)
G03F 7/30 (2006.01)

(52) U.S. Cl. .................... 430/270.1; 430/325; 430/330; 430/905; 430/910

(58) Field of Classification Search ............ 430/270.1, 430/325, 905, 910, 330
See application file for complete search history.

(56) References Cited

U.S. PATENT DOCUMENTS

| | | | | |
|---|---|---|---|---|
| 5,538,820 A | * | 7/1996 | Fisher | 430/18 |
| 5,916,729 A | * | 6/1999 | Kobayashi et al. | 430/270.1 |
| 5,965,319 A | * | 10/1999 | Kobayashi | 430/176 |
| 6,114,082 A | * | 9/2000 | Hakey et al. | 430/270.1 |
| 6,190,833 B1 | * | 2/2001 | Shiota et al. | 430/280.1 |
| 6,306,555 B1 | * | 10/2001 | Schulz et al. | 430/270.1 |
| 6,511,783 B1 | * | 1/2003 | Uenishi | 430/270.1 |
| 6,576,394 B1 | | 6/2003 | Xu et al. | |
| 6,653,043 B1 | * | 11/2003 | Hanabata | 430/270.1 |
| 6,673,512 B1 | * | 1/2004 | Uenishi et al. | 430/270.1 |
| 6,773,862 B2 | * | 8/2004 | Shirakawa et al. | 430/270.1 |
| 6,977,131 B2 | * | 12/2005 | Tao | 430/270.1 |
| 2003/0022095 A1 | * | 1/2003 | Kai et al. | 430/170 |

FOREIGN PATENT DOCUMENTS

| | | |
|---|---|---|
| JP | 2-15270 | 1/1990 |
| JP | 2861309 | 12/1998 |
| JP | 2985968 | 10/1999 |
| JP | 2001-51417 | 2/2001 |
| JP | 2001-114825 A | 4/2001 |
| JP | 2001-166476 A | 6/2001 |
| JP | 2002-49155 A | 5/2002 |
| JP | 2002-131908 A | 5/2002 |
| JP | 2004-503830 T | 2/2004 |
| WO | WO 01/96960 A1 | 12/2001 |

OTHER PUBLICATIONS

Japanese Office Action dated Mar. 19, 2008.

* cited by examiner

*Primary Examiner*—John S Chu
(74) *Attorney, Agent, or Firm*—Sughrue Mion, PLLC

(57) ABSTRACT

A negative resist composition of the present invention comprises: (A) an alkali-soluble resin; (B-1) a cross-linking agent capable of cross-linking with the alkali-soluble resin (A) by the action of an acid, in which the cross-linking agent is a phenol compound containing: in the molecule one or more benzene rings; and at least two cross-linking groups bonded to any of the benzene rings, the cross-linking group being a group selected from the group consisting of a hydroxymethyl group, an alkoxymethyl group and an acyloxymethyl group; (B-2) a cross-linking agent capable of cross-linking with the alkali-soluble resin (A) by the action of an acid, in which the cross-linking agent contains at least two specific groups; and (C) a compound capable of generating an acid upon irradiation with an actinic ray or radiation.

17 Claims, No Drawings

NEGATIVE RESIST COMPOSITION

FIELD OF THE INVENTION

The present invention relates to a negative resist composition suitable for use in ultramicro-lithographic processes for manufacturing VLSI chips and high-capacity microchips, and in other photofabrication processes. More specifically, the invention is concerned with a negative resist composition capable of forming finer patterns by using electron beams or X-rays in particular.

BACKGROUND OF THE INVENTION

Hitherto, fine patterning by lithography using photoresist compositions has been performed in processes of manufacturing semiconductor devices, such as ICs and LSI. In recent years, increasing need for larger packing densities of integrated circuits has come to entail superfine patterning in the submicron or quatermicron region. In response to such a requirement, the light sources used in photolithography are showing a tendency to have shorter wavelengths. Actually, the exposure light used has been changed from g-ray to i-ray, and further to KrF excimer laser beam. And nowadays the development of lithographic processes using not only excimer laser beams but also electron beams and X-rays is proceeding.

Electron-beam lithography in particular is placed as a next-generation patterning technology or a generation-after-next patterning technology, and it is desired to develop negative resist highly sensitive to electron beams and capable of forming highly resolved patterns. Enhancement of resist sensitivity is a very important problem in pursuing reduction of wafer processing time. As to the electron-beam negative resist, however, pursuit of increased sensitivity causes a worsening of line edge roughness in addition to reduction of resolution and deterioration in pattern profile, thereby resulting in a problem of greatly reducing yield rates of devices. Therefore, it is strongly desired to develop resist compositions satisfying those quality requirements at the same time. The term "line edge roughness" as used here in means rough appearance the pattern-substrate interface edge has when resist patterns are viewed from right above, wherein the roughness of the pattern-substrate interface edge arises from irregular fluctuation in a direction perpendicular to the line direction that is attributed to resist properties. Transfer of this roughness occurs in the etching process using the resist as a mask and gives rise to deterioration in electric properties and decrease in yield rate. High sensitivity bears a trade-off relation to high resolution, pattern profiles of good quality and satisfactory line edge roughness, and so how to satisfy these properties at the same time is a very important problem.

As resist suitable for such electron-beam and X-ray lithographic processes, chemical amplification resist utilizing mainly an acid catalyst has been mainly used from a sensitivity-oriented point of view. With respect to negative resist of this type, chemical amplification resist compositions containing mainly an alkali-soluble resin, a cross-linking agent, an acid generator and additives have been used effectively.

Various studies to improve performances of chemical amplification negative resist have been made from the viewpoint of focusing attention on cross-linking agents. For instance, the cross-linking agents of glycoluril type, the cross-linking agents of hexamethoxymelamine type, the cross-linking agents having urea skeletons and the phenolic cross-linking agents containing polynuclear phenol skeletons are disclosed in JP-A-2-15270, Japanese Patent No. 2985968, Japanese Patent No. 2861309 and JP-A-2001-51417, respectively.

In the superfine regions, however, any of hitherto known cross-linking agents including the above-cited ones were unsuccessful in satisfying all the performance requirements, namely high sensitivity, high resolution, good-quality pattern profile and satisfactory line edge roughness.

SUMMARY OF THE INVENTION

Therefore, the invention aims at solving technological problems facing performance improvements in finer patterning for semiconductor devices. More particularly, an object of the invention is to provide a negative resist composition that can ensure all of high sensitivity, high resolution, good-quality pattern profile and satisfactory line edge roughness in superfine patterning for semiconductor chips by the use of electron beams or X-rays.

As a result of our intensive studies, it has been found that the aforementioned object can be attained with a chemical amplification negative resist composition containing an alkali-soluble resin, a phenolic cross-linking agent having a particular structure, a cross-linking agent having N-methylol groups, and an acid generator.

More specifically, the following are embodiments of the invention.

(1) A negative resist composition comprising:

(A) an alkali-soluble resin;

(B-1) a cross-linking agent capable of cross-linking with the alkali-soluble resin (A) by the action of an acid, in which the cross-linking agent is a phenol compound containing: in the molecule one or more benzene rings; and at least two cross-linking groups bonded to any of the benzene rings, the cross-linking group being a group selected from the group consisting of a hydroxymethyl group, an alkoxymethyl group and an acyloxymethyl group;

(B-2) a cross-linking agent capable of cross-linking with the alkali-soluble resin (A) by the action of an acid, in which the cross-linking agent contains at least two groups selected from the groups represented by the following formula (1) and represented by the following formula (2); and (C) a compound capable of generating an acid upon irradiation with an actinic ray or radiation:

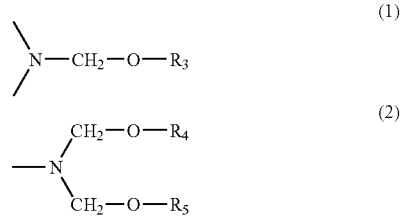

wherein $R_3$ represents a hydrogen atom, an alkyl group, or an alkylcarbonyl group; $R_4$ and $R_5$ each represent a hydrogen atom, an alkyl group or an alkylcarbonyl group.

(2) The negative resist composition as described in the item (1), wherein the alkali-soluble resin (A) contains a repeating unit represented by the following formula (3):

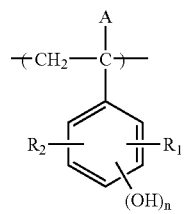
(3)

wherein A represents a hydrogen atom, an alkyl group, a halogen atom, or a cyano group; $R_1$ and $R_2$ each represent a hydrogen atom, a halogen atom, an alkyl group, an alkenyl group, a cycloalkyl group, an aryl group, an aralkyl group, an alkoxy group or an alkylcarbonyloxy group; n represents an integer of 1 to 3.

(3) The negative resist composition as described in the item (1) or (2), which further comprises (D) a nitrogen-containing basic compound.

(4) The negative resist composition as described in any one of the items (1) to (3), wherein the alkali-soluble resin (A) contains at least one repeating unit selected from repeating units represented by the following formulae (4), (5) and (6):

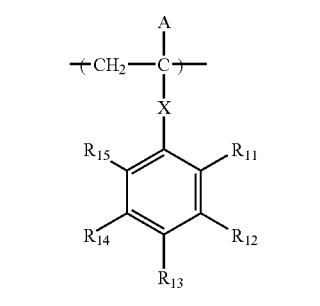
(4)

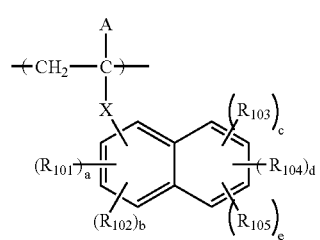
(5)

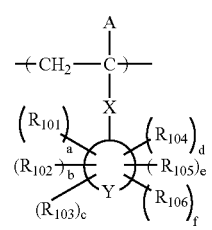
(6)

wherein

represents a group selected from any of the following structures;

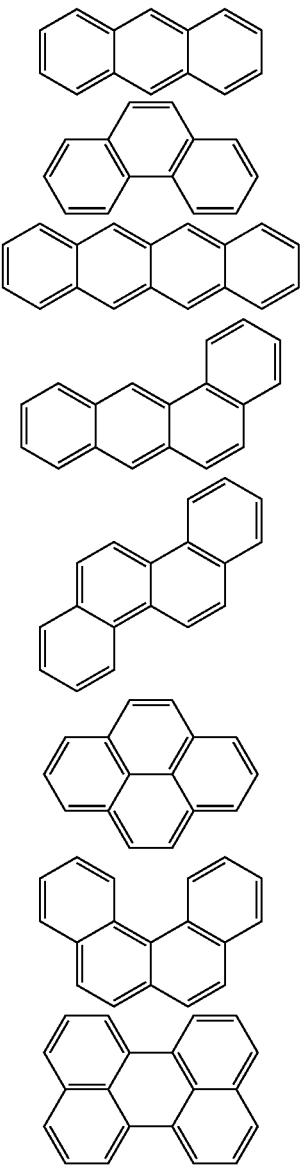

A has the same meaning as in formula (3); X is a single bond, —COO—, —O—, or —CON($R_{16}$)—; $R_{16}$ represents a hydrogen atom, or an alkyl group; $R_{11}$ to $R_{15}$ each represent the same meaning as $R_1$ in formula (3); $R_{101}$ to $R_{106}$ each represent a hydroxyl group, a halogen atom, an alkyl group, an alkoxy group, an alkylcarbonyloxy group, an alkylsulfonyloxy group, an alkenyl group, an aryl group, an aralkyl group, or a carboxyl group; a to f each represent an integer of from 0 to 3.

(5) The negative resist composition as described in any one of the items (1) to (4), which further contains a surfactant.

(6) The negative resist composition as described in any one of the items (2) to (5), wherein the alkali-soluble resin (A) contains the repeating unit represented by the formula (3) in an amount of 50 to 100 mole %.

(7) The negative resist composition as described in any one of the items (4) to (6), wherein the alkali-soluble resin (A)

contains at least one repeating unit selected from repeating units represented by the formulae (4), (5) and (6) in an amount of 3 to 50 mole %.

(8) The negative resist composition as described in any one of the items (1) to (7), wherein the cross-linking agent (B-1) is a phenol derivative having: a molecular weight of 2,000 or below; 3 to 5 benzene rings per molecule; and at least two cross-linking groups per molecule, in which the cross-linking group is a group selected from a hydroxymethyl group, an alkoxymethyl group or an acyloxymethyl group, and the cross-linking group is bonded to any of the benzene rings.

(9) The negative resist composition as described in any one of the items (1) to (7), wherein the cross-linking agent (B-1) is a phenol derivative having: 1 to 2 benzene rings per molecule; and at least two cross-linking groups per molecule, in which the cross-linking group is a group selected from a hydroxymethyl group, an alkoxymethyl group or an acyloxymethyl group, and the cross-linking group is bonded to any of the benzene rings.

(10) The negative resist composition as described in any one of the items (1) to (9), wherein the cross-linking agent (B-2) includes one of a compound or resin containing a melamine skeleton, a compound or resin containing an urea skeleton, a compound or resin containing an imidazolidine skeleton, and a compound or resin containing a glycoluril skeleton.

(11) The negative resist composition as described in any one of the items (1) to (10), which comprises the cross-linking agent (B-1) in a proportion of 0.5 to 50% by weight, to the total solid content in the negative resist composition.

(12) The negative resist composition as described in any one of the items (1) to (11), which comprises the cross-linking agent (B-2) in a proportion of 0.5 to 50% by weight, to the total solid content in the negative resist composition.

(13) The negative resist composition as described in any one of the items (1) to (12), wherein the ratio between the cross-linking agents (B-1) and (B-2) is from 3/97 to 97/3 by mole.

(14) A method of forming a resist pattern, which comprises: forming a resist film including the negative resist composition described in any one of the items (1) to (13); irradiating the resist film with an actinic ray or radiation; and developing the irradiated resist film.

DETAILED DESCRIPTION OF THE INVENTION

Negative resist compositions according to the invention are described below in detail.

[1] Alkali-Soluble Resins (Component(A))

The alkali-soluble resins used in the invention have no particular restrictions, but can be polymers having phenol skeletons which have hitherto been used widely in negative resist of chemical amplification type. Examples of such polymers include phenol novolak resins, polyvinyl phenol resins, copolymers containing structural units derived from vinyl phenol, and resins prepared by partially protecting or modifying polyvinyl phenol resins.

In the invention, it is preferable to use alkali-soluble resins which can dissolve in alkali at a speed of at least 20 Å/sec, especially at least 200 Å/sec, as measured with 0.261N tetramethylammonium hydroxide (TMAH) at 23° C.

The molecular weight of alkali-soluble resin used in the invention is, on the weight average, preferably from 1,000 to 200,000, far preferably from 2,000 to 50,000.

The suitable molecular weight distribution (Mw/Mn) of alkali-soluble resin used in the invention is from 1.0 to 2.5, preferably from 1.0 to 2.0, particularly preferably from 1.0 to 1.5.

The term "weight average molecular weight" as used herein is defined as the molecular weight measured by gel permeation chromatography and calculated in terms of polystyrene.

The amount of alkali-soluble resin used in the invention is generally from 30 to 95%, preferably from 40 to 90%, far preferably from 50 to 80%, of the total weight of solid components in the present composition.

Examples of an alkali-soluble resin used to advantage in the invention include resins containing repeating units represented by formula (3).

The alkyl group suitable as A in formula (3) is a 1-3C (1-3 carbon atoms) alkyl group. Examples of a halogen atom represented by A include Cl, Br and F.

The substituent preferred as A is a hydrogen atom or a 1-3C alkyl group (e.g., methyl, ethyl), especially a hydrogen atom or a methyl group.

Examples of a halogen atom represented by $R_1$ and $R_2$ each include Cl, Br, F and I.

The alkyl group, the alkenyl group, the cycloalkyl group, the aryl group, the aralkyl group, the alkoxy group or the alkylcarbonyloxy group represented by $R_1$ and $R_2$ each may have a substituent. Further, $R_1$ and $R_2$ may form a ring in cooperation with each other.

$R_1$ and $R_2$ each is preferably a 1-8C linear or branched alkyl group which may have a substituent, a 2-8C alkenyl group which may have a substituent, a 5-10C cycloalkyl group which may have a substituent, a 6-15C aryl group which may have a substituent, a 7-16C aralkyl group which may have a substituent, a 1-8C alkoxy group which may have a substituent, or a 2-8C alkylcarbonyloxy group which may have a substituent.

Examples of such a substituent include alkyl groups (such as a methyl group, an ethyl group, a propyl group, an isopropyl group, a butyl group, a t-butyl group and a hexyl group), aryl groups (such as a phenyl group and a naphthyl group), aralkyl groups, a hydroxyl group, alkoxy groups (such as a methoxy group, an ethoxy group, a butoxy group, an octyloxy group and a dodecyloxy group), acetyl groups (such as an acetyl group, a propanoyl group and a benzoyl group) and an oxo group.

It is preferable by far that $R_1$ and $R_2$ each represent a hydrogen atom, a halogen atom, a 1-4C alkyl group which may have a substituent, a 1-4C alkoxy group which may have a substituent, or a 2-4C alkylcarbonyloxy group which may have a substituent. Of the above-recited ones, a hydrogen atom, a chlorine atom, a bromine atom, an iodine atom, a 1-3C alkyl group (e.g., methyl, ethyl, propyl, isopropyl) and a 1-3C alkoxy group (e.g., methoxy, ethoxy, propyloxy, isopropyloxy) are suitable in particular as $R_1$ and $R_2$ each.

n represents an integer of 1 to 3, preferably 1 or 2. In formula (3), though each OH group may be bonded to any position on the ring, the suitable bonding position thereof is the 3- or 4-position of the ring.

It is also preferable for the resin of Component (A) to contain repeating units of at least one kind selected from repeating units represented by formula (4), (5) or (6) from the viewpoint of increasing a speed at which the resist film dissolves in an alkali and making improvement in film quality. Still another resin preferred as the resin of Component (A) is a resin containing not only repeating units represented by formula (3) but also repeating units of at least one kind selected from repeating units of formula (4), (5) or (6).

In formulae (4) to (6), A has the same meaning as in formula (3). X represents a single bond, —COO—, —O— or —CON (R$_{16}$)—. R$_{16}$ represents a hydrogen atom or an alkyl group (preferably an alkyl group containing 1 to 3 carbon atoms, such as a methyl group, an ethyl group or a propyl group). Of the above-recited ones, the linkages preferred as X are a single bond, —COO— and —CON(R$_{16}$)—, especially a single bond and —COO—.

R$_{11}$ to R$_{15}$, which are independent of one another, each have the same meaning as R$_1$ in formula (3).

It is preferable that R$_{101}$ to R$_{106}$ each represent a hydroxyl group, a halogen atom (CL, Br, F, I), a 1-8C linear or branched alkyl group which may have a substituent, a 1-8C linear or branched alkoxy group which may have a substituent, a 2-4C linear or branched alkylcarbonyloxy group which may have a substituent, a 1-8C linear or branched alkylsulfonyloxy group which may have a substituent, a 2-8C alkenyl group which may have a substituent, a 6-15C aryl group which may have a substituent, a 7-16C aralkyl group which may have a substituent, or a carboxyl group.

Examples of those substituents include the same ones as included in the examples of a substituent the group represented by R$_1$ in formula (3) may have.

It is preferable by far that R$_{101}$ to R$_{106}$ each represent a hydroxyl group, a halogen atom, a 1-4C alkyl group which may have a substituent, a 1-4C alkoxy group which may have a substituent, or a 2-4C alkylcarbonyloxy group which may have a substituent. In particular, a hydrogen atom, a hydroxyl group, a chlorine atom, a bromine atom, an iodine atom, a 1-3C alkyl group (e.g., methyl, ethyl, propyl, isopropyl), a 1-3C alkoxy group (e.g., methoxy, ethoxy, propyloxy, isopropyloxy) and a 2-3C alkylcarbonyloxy group (e.g., acetyl, propionyl) are preferred over the others.

a to f each are an integer of 0 to 3 independently.

Other polymerizable monomers enabling the control of film formability and alkali solubility may participate in polymerization for synthesizing the resin of Component (A) including the resin containing repeating units represented by formula (3), the resin containing repeating units represented by formula (4), (5) or (6), or the resin containing repeating units represented by formula (3), and besides, repeating units of at least one kind represented by formula (4), (5) or (6).

Examples of such polymerizable monomers include styrene, alkyl-substituted styrene, alkoxy-substituted styrene, O-alkylated styrene, O-acylated styrene, hydrogenated hydroxystyrene, maleic anhydride, acrylic acid derivatives (including acrylic acid and acrylic acid esters), methacrylic acid derivatives (including methacrylic acid and methacrylic acid esters), N-substituted maleimides, acrylonitrile and methacrylonitrile. However, the monomers usable therein should not be construed as being limited to these examples.

The content of the repeating units represented by formula (3) in the resin of Component (A) is generally from 50 to 100 mole %, preferably from 70 to 100 mole %.

The content of the repeating units represented by formulae (4) to (6) in the resin of Component (A) is generally from 3 to 50 mole %, preferably from 5 to 30 mole %.

The suitable ratio of the repeating units represented by formula (3) to the repeating units represented by formulae (4) to (6) is from 100/0 to 50/50, preferably from 100/0 to 60/40, particularly preferably from 100/0 to 70/30, by mole.

The resin of Component (A) can be synthesized by known radical or anionic polymerization method. In a radical polymerization method, for instance, polymers can be obtained by dissolving vinyl monomers in an appropriate solvent and subjecting them to polymerization reaction in the presence of an initiator, such as a peroxide (e.g., benzoyl peroxide), a nitrile compound (e.g., azoabisisobutyronitrile), or a redox compound (e.g., cumene hydroperoxide-ferrous salt), at room temperature or under a temperature-raised condition. In an anionic polymerization method, on the other hand, polymers can be obtained by dissolving vinyl monomers in an appropriate solvent and polymerizing the monomers by the use of a metallic compound (e.g., butyl lithium) as an initiator under a cooling condition.

Examples of an alkali-soluble resin used to advantage in the invention are illustrated below, but these examples should not be construed as limiting the scope of the invention.

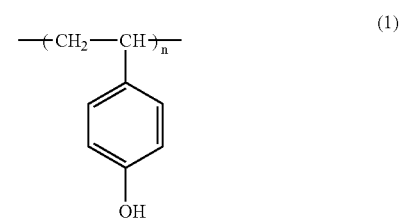

(1)

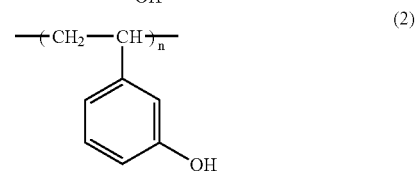

(2)

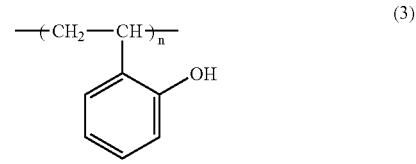

(3)

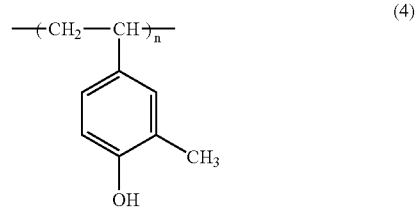

(4)

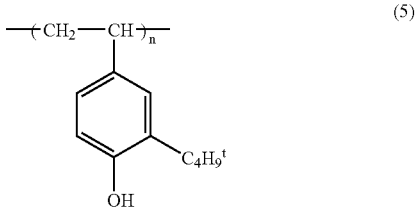

(5)

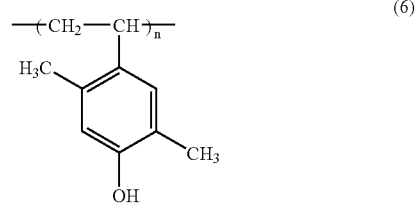

(6)

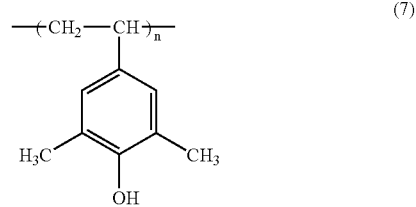

(7)

-continued
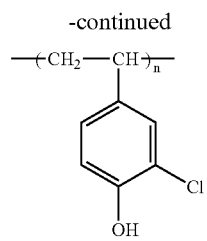
(8)
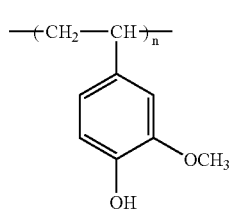
(9)
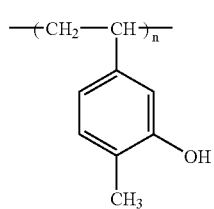
(10)
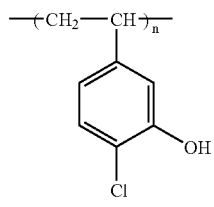
(11)
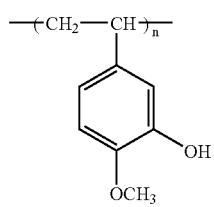
(12)
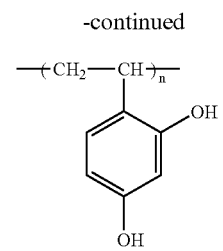
(13)
-continued
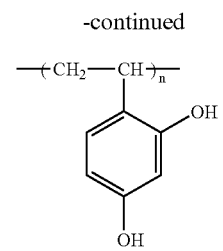
(14)
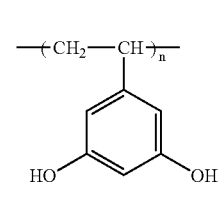
(15)
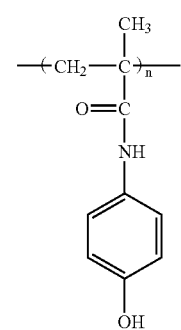
(16)
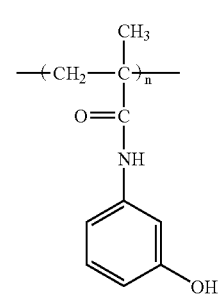
(17)
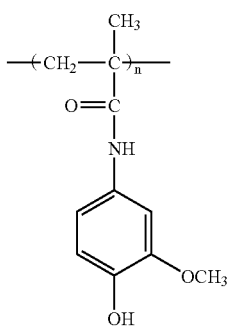
(18)

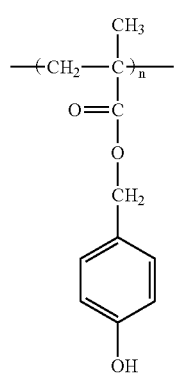
(19)
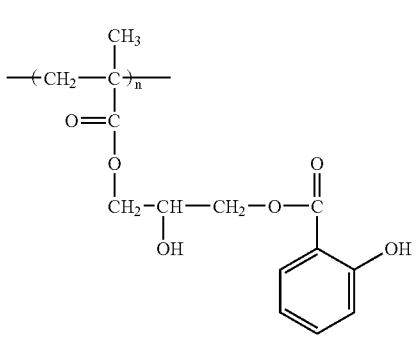
(23)
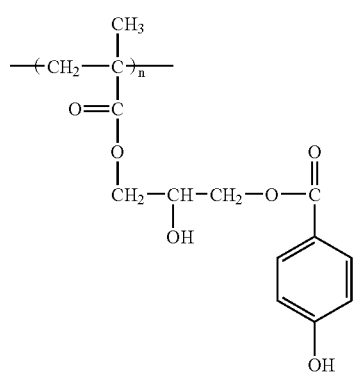
(20), (24)
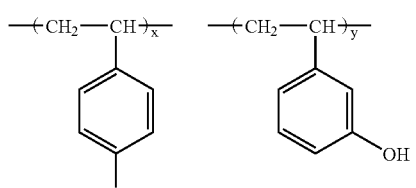
(21), (25)
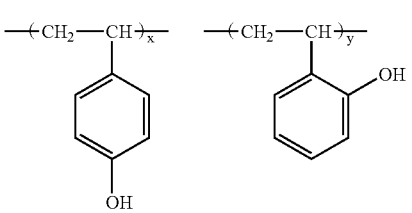
(22), (26)
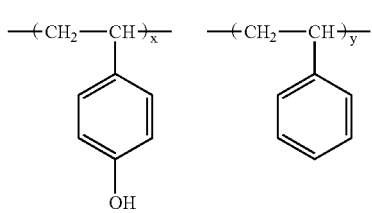
(27)

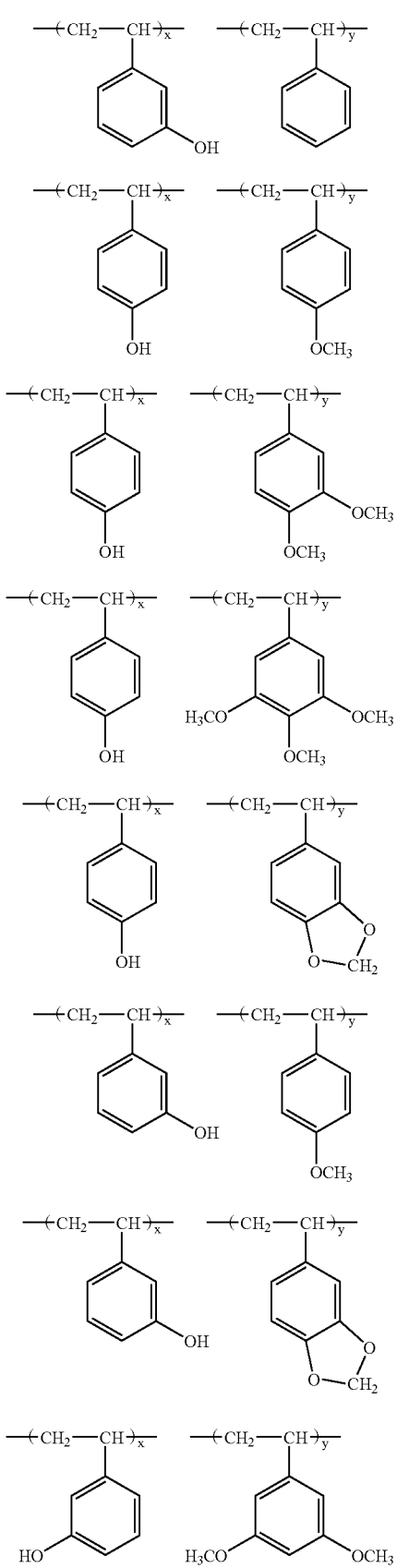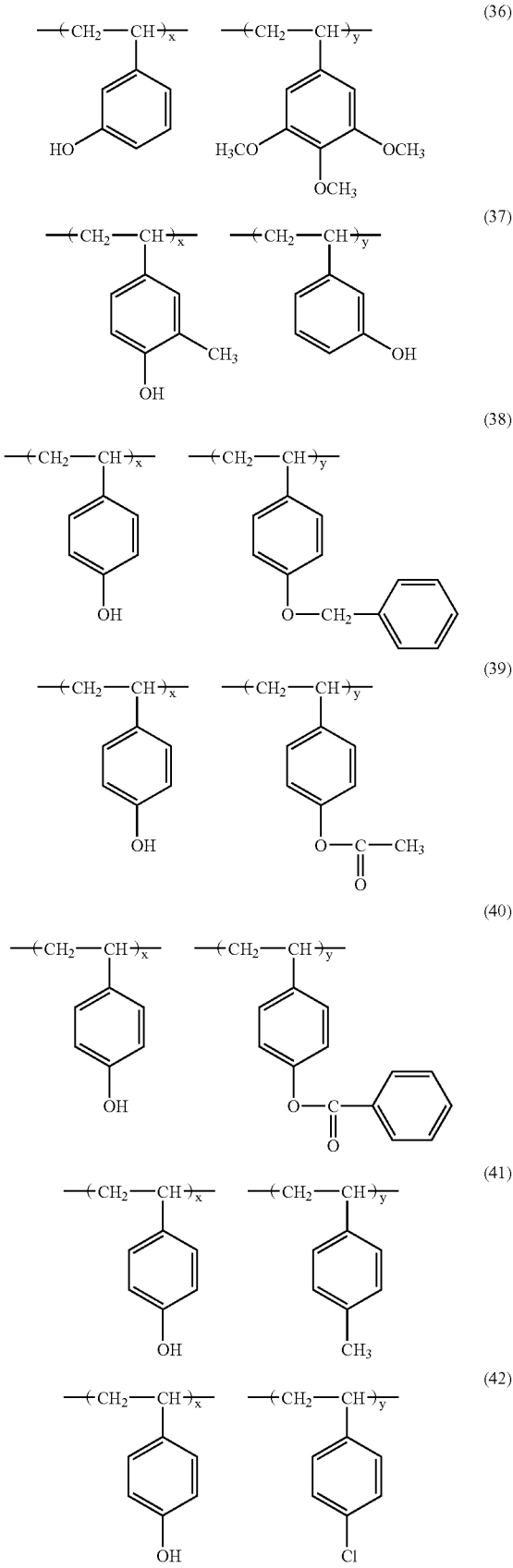

-continued
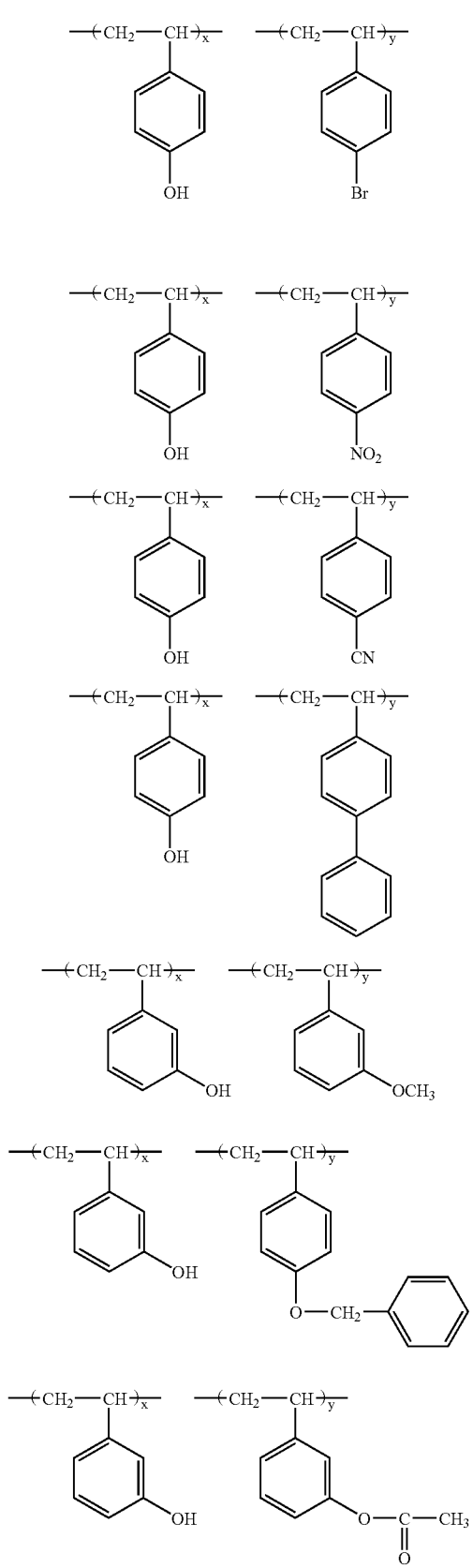
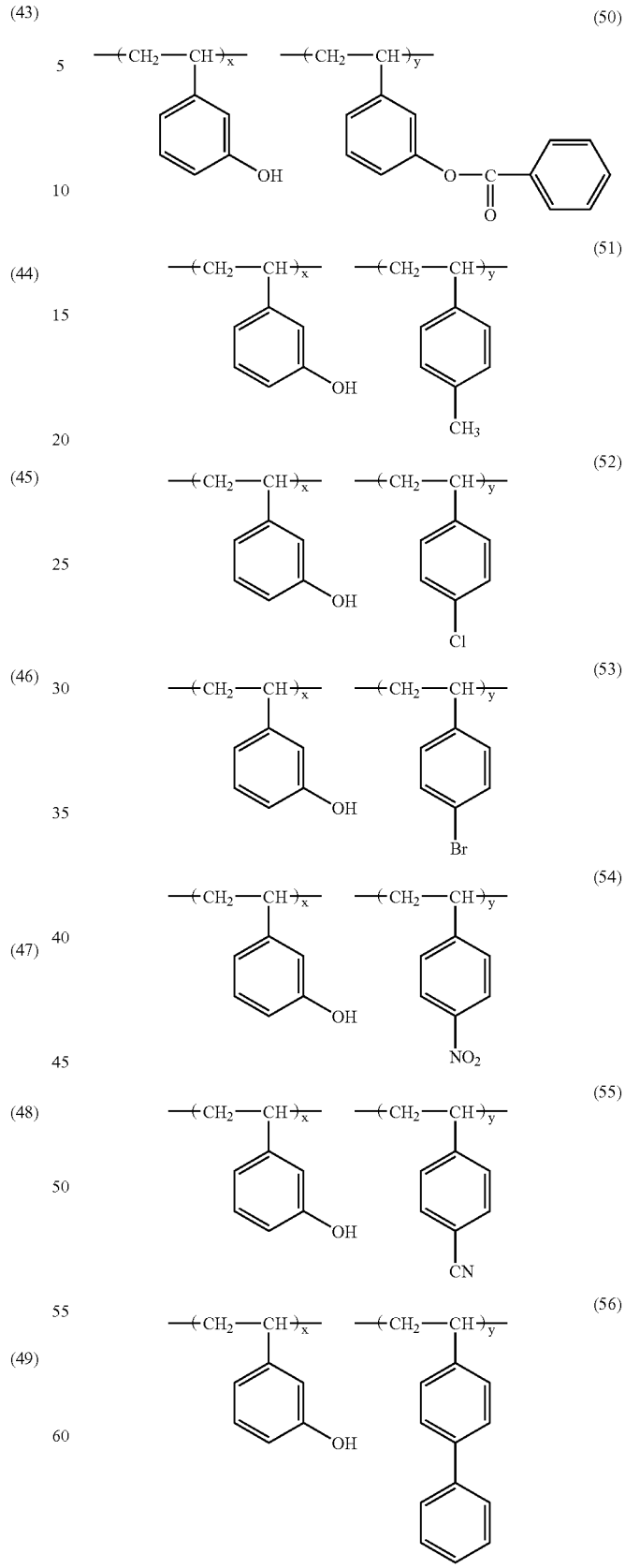

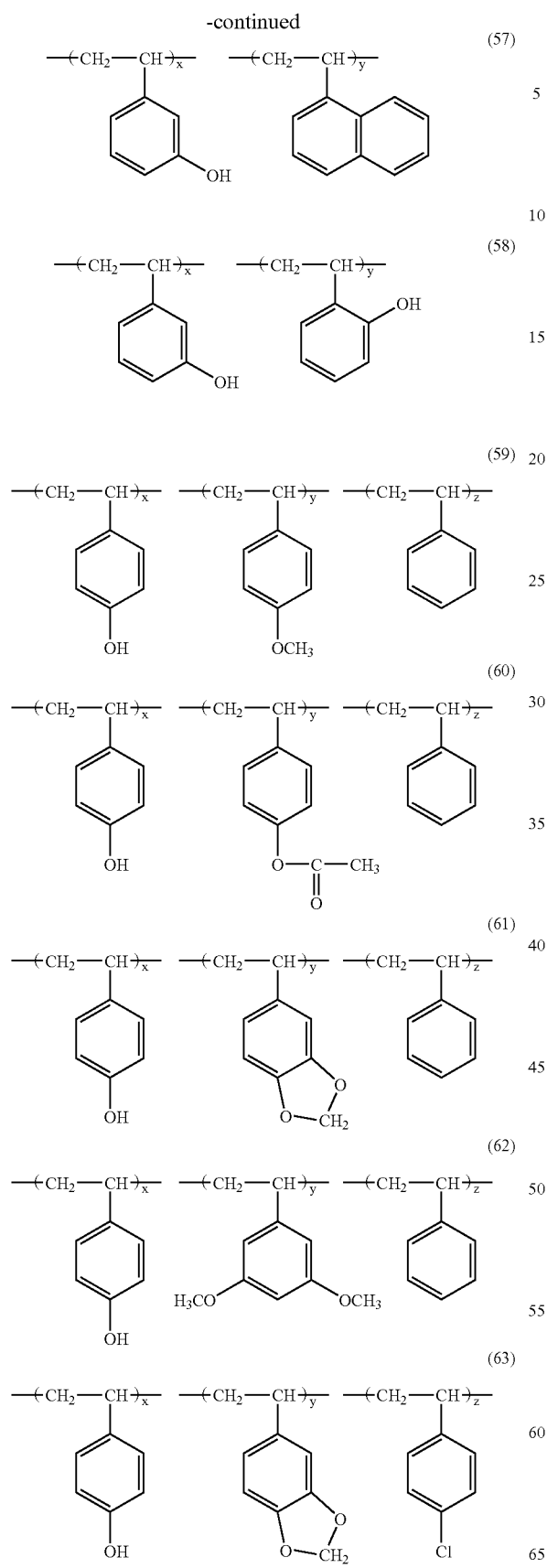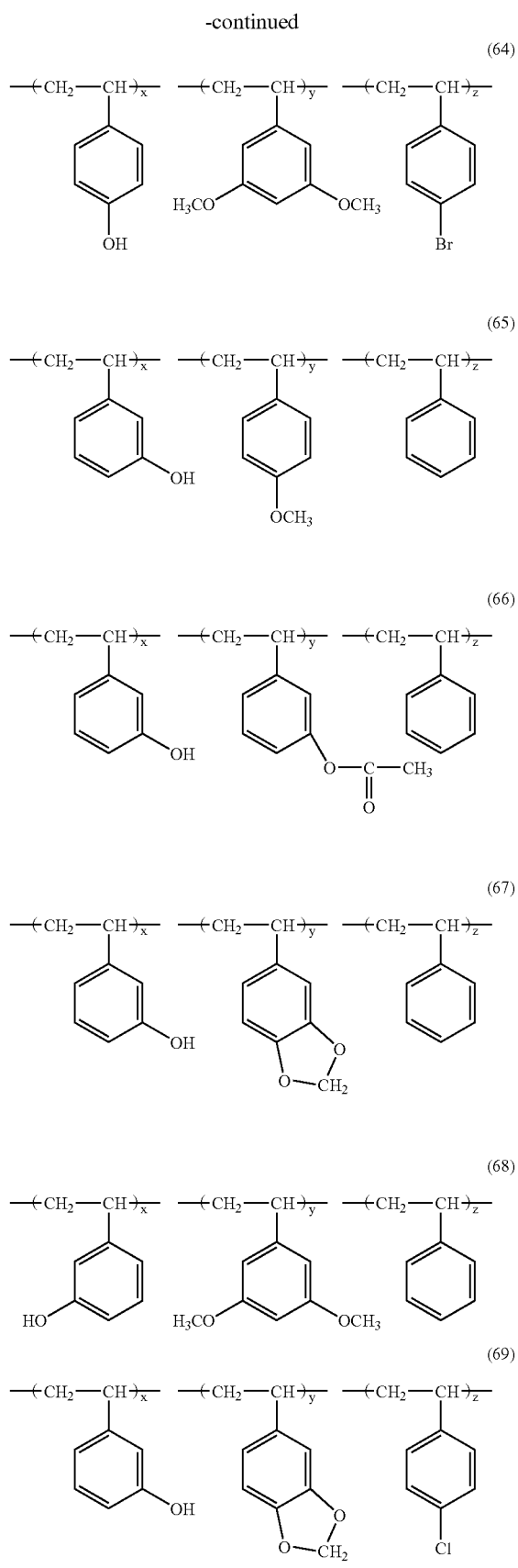

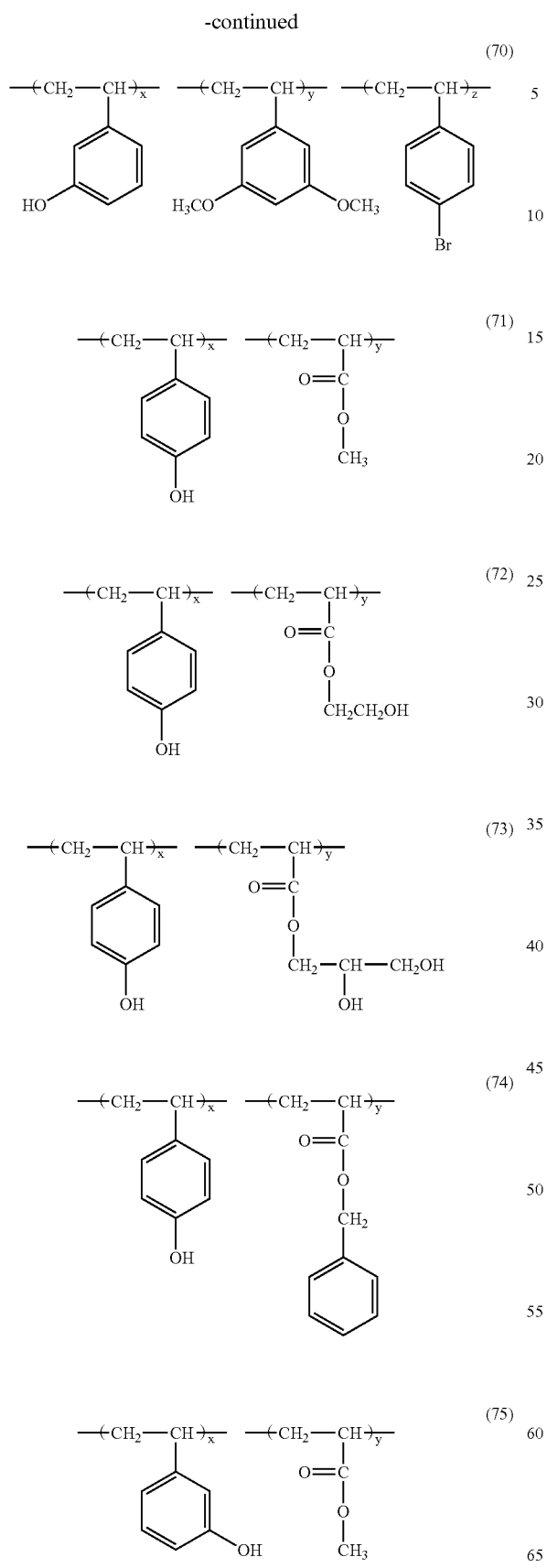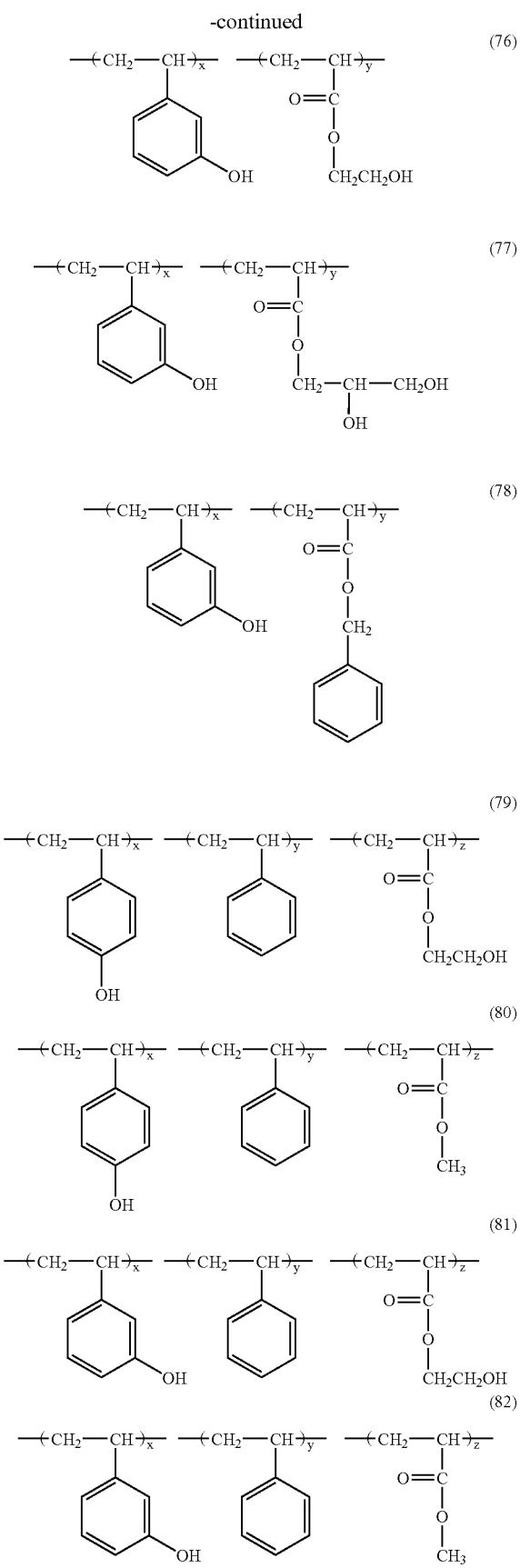

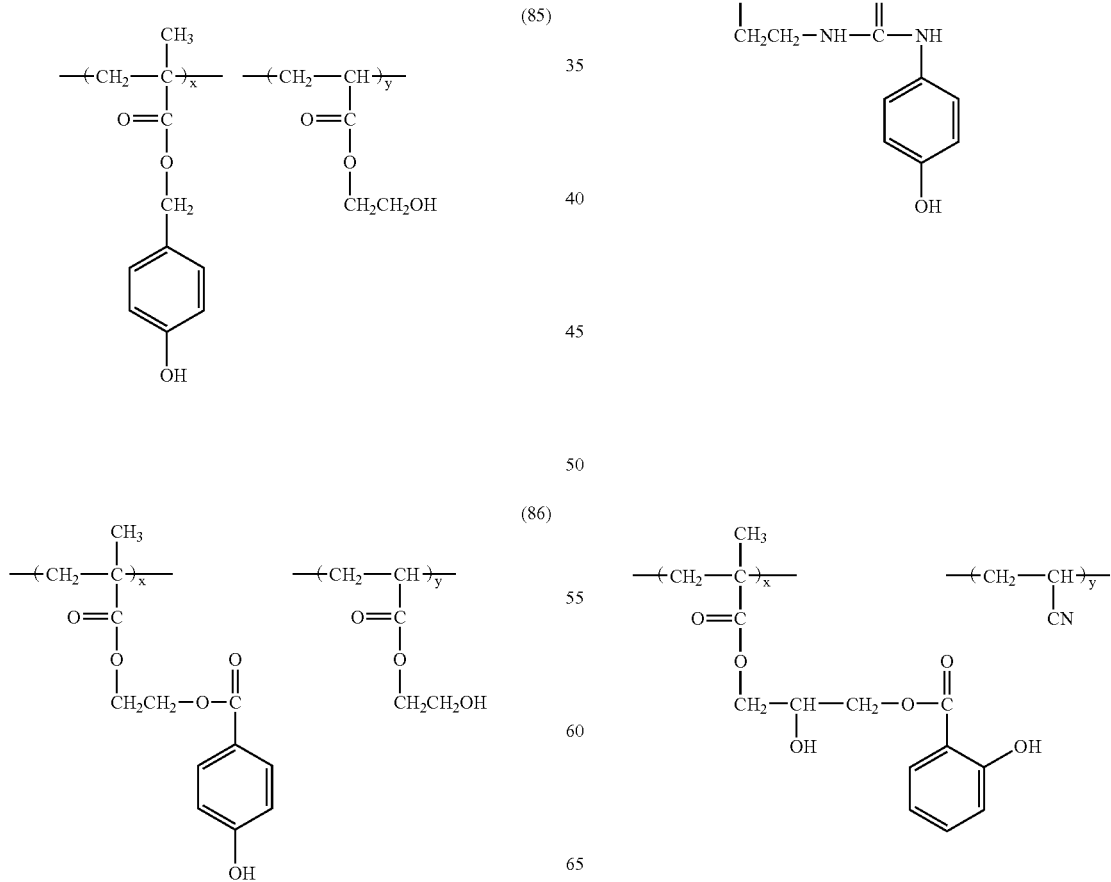

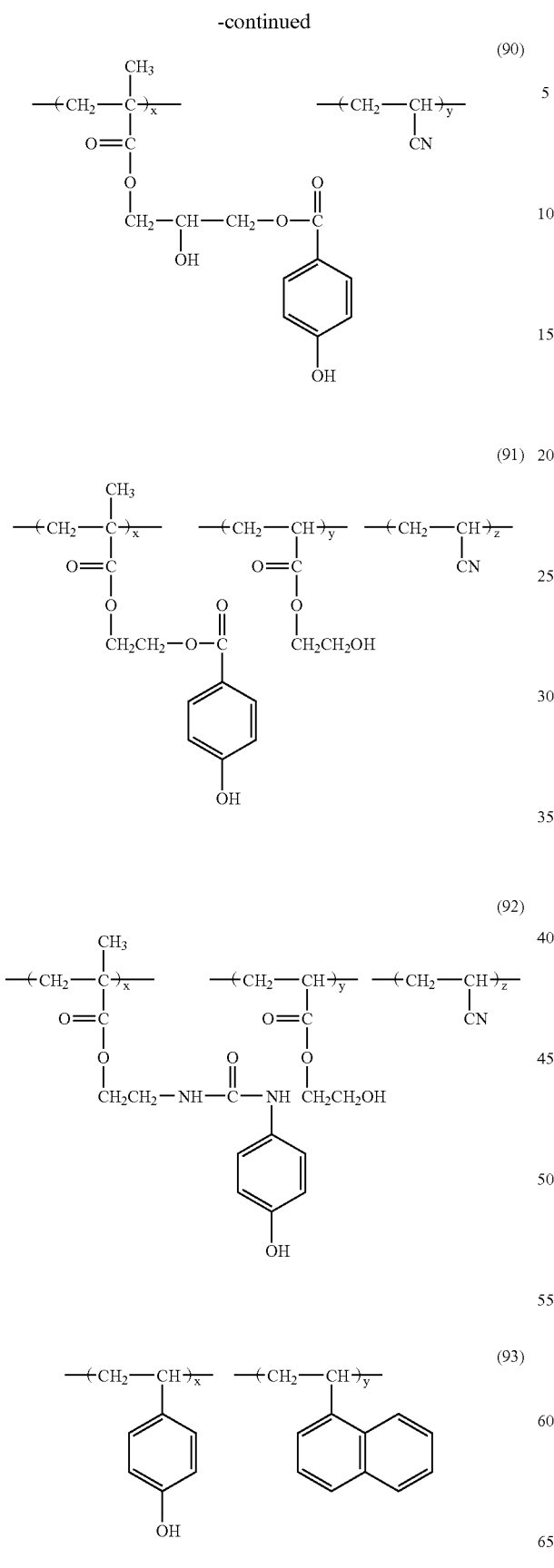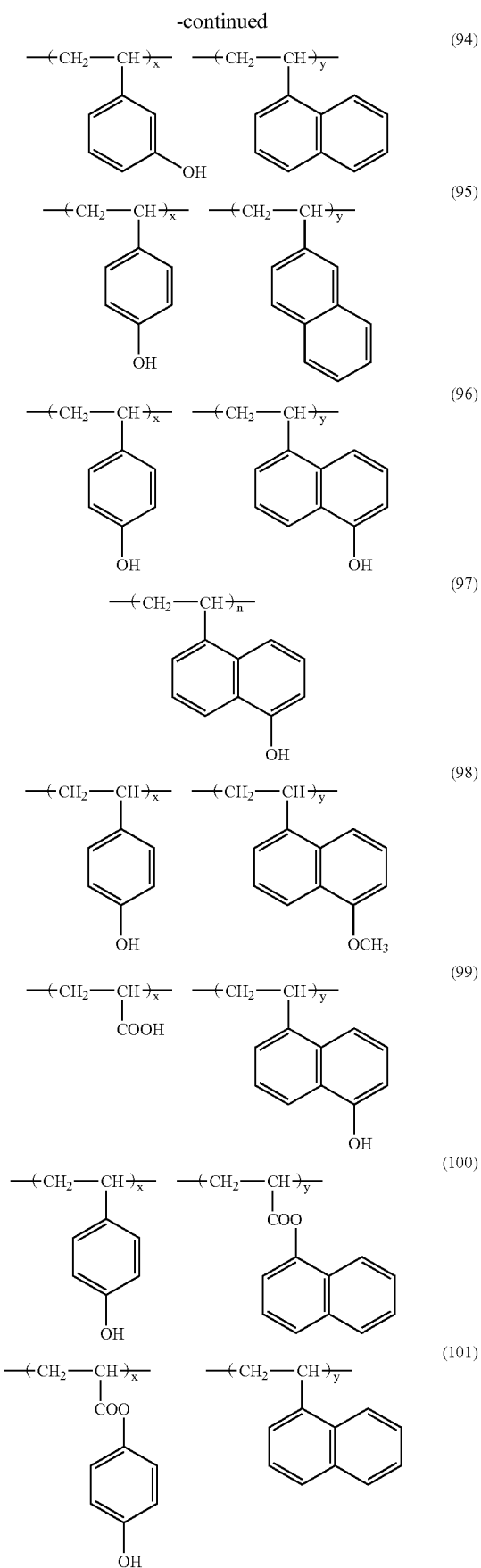

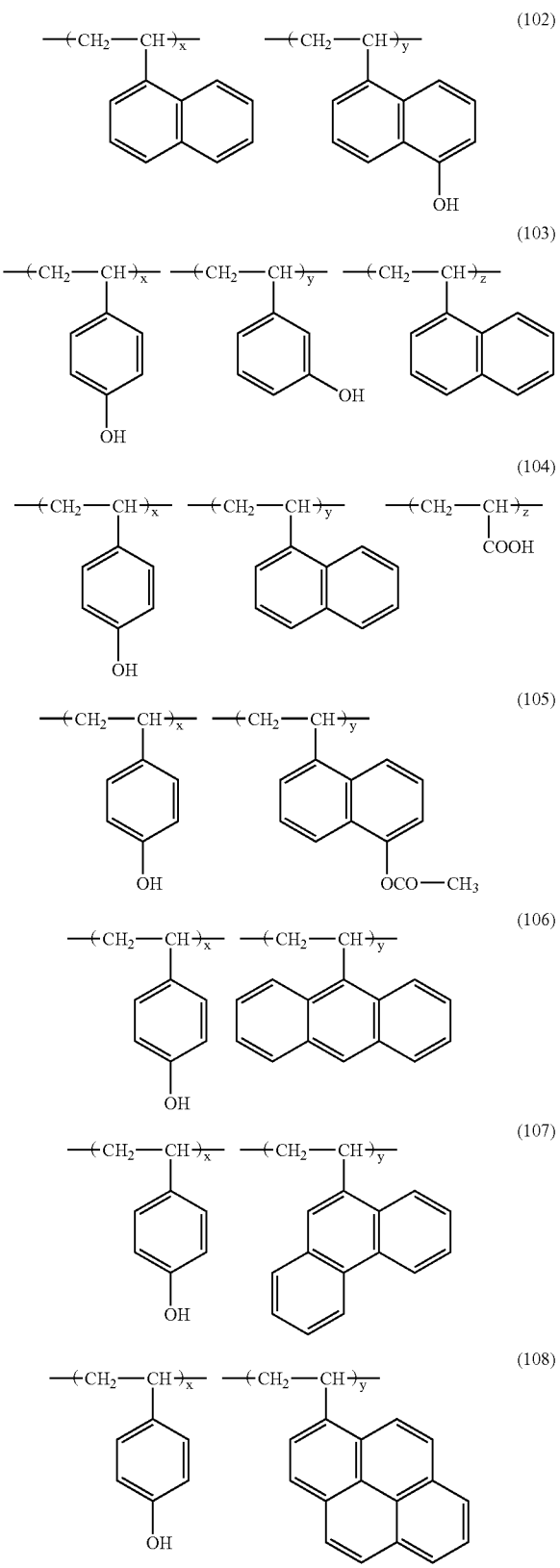

In the above resin's examples, n represents a positive integer, and x, y and z represent percentages of the repeating units corresponding thereto respectively in each resin. In the cases of resin synthesized from two kinds of monomers, the resin used in the invention has its x value in the range of 10 to 95 and its y value in the range of 5 to 90, preferably its x value in the range of 40 to 90 and its y value in the range of 10 to 60. In the cases of resin synthesized from three kinds of monomers, the resin used in the invention has its x value in the range of 10 to 90, its y value in the range of 5 to 85 and its z value in the range of 5 to 85. And it is advantageous for the resin used to have its x value in the range of 40 to 80, its y value in the range of 10 to 50 and its z value in the range of 10 to 50.

As the alkali-soluble resin of Component (A) in the invention, a copolymer including a repeating unit having monocyclic aromatic structures and a repeating unit having polycyclic aromatic structures is more suitable.

The alkali-soluble resins containing any of repeating units represented by formulae (3) to (6), which are used to advantage in the invention, can also be used in combination with other alkali-soluble resins. The proportion of other alkali-soluble resins usable in the invention is generally up to 100 parts by weight per 100 parts by weight of the alkali-soluble resins preferred in the invention.

Examples of the other alkali-soluble resins include novolak resin, hydrogenated novolak resin, acetone-pyrogallol resin, styrene-maleic anhydride copolymer, carboxyl group-containing methacrylic resin and derivatives thereof, but these examples should not be construed as limiting the scope of the invention.

[2] Cross-Linking Agents (Component (B))

[2-1] Cross-Linking Agent of Present Component (B-1):

The cross-linking agent of Component (B-1) is a phenol derivative having one or more benzene rings per molecule and at least two cross-linking groups per molecule. And these cross-linking groups are selected from a hydroxymethyl group, alkoxymethyl groups or acyloxymethyl groups and bonded to at least any of the benzene rings contained in the phenol derivative.

The cross-linking agent of Component (B-1) preferred in particular can be a phenol derivative having a molecular weight of 2,000 or below, preferably 1,200 or below, 3 to 5 benzene rings per molecule and at least two cross-linking groups per molecule. These cross-linking groups are groups selected from a hydroxymethyl group, alkoxymethyl groups or acyloxymethyl groups, and they may be bonded to any of the benzene rings, specifically in a state of being concentrated on any of the benzene rings or being apportioned among all the benzene rings. By using such a phenol derivative, the effects of the invention can be rendered more pronounced.

The suitable alkoxymethyl groups bonded to the benzene rings are those containing 2 to 6 carbon atoms, with examples including a methoxymethyl group, an ethoxymethyl group, an n-propoxymethyl group, an i-propoxymethyl group, an n-butoxymethyl group, an i-butoxymethyl group, a sec-butoxymethyl group and a t-butoxymethyl group. In addition, alkoxy-substituted alkoxymethyl groups, such as 2-methoxyethoxymethyl and 2-methoxy-1-propoxymethyl, are also preferred.

The minimum molecular weight of the cross-linking agent of Component (B-1) is generally 150, preferably 200, far preferably 300.

The suitable number of cross-linking groups is an average of 1 to 2 a benzene ring, preferably an average of 1.2 to 2 a benzene ring.

Of these phenol derivatives, the following are particularly preferable ones:

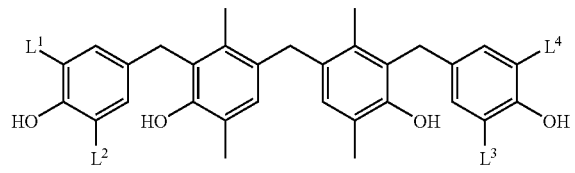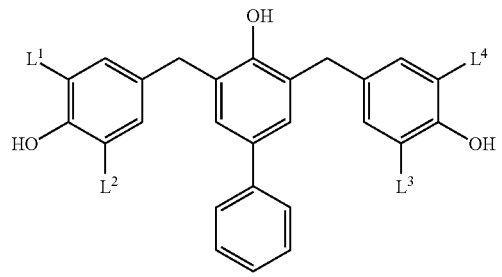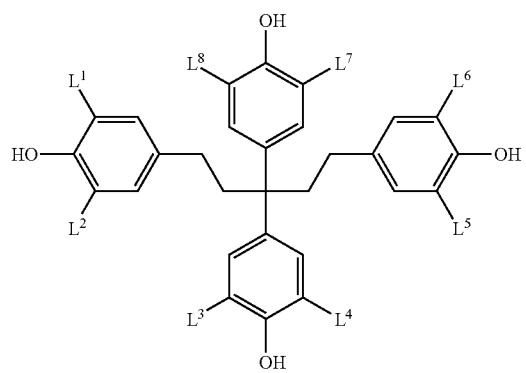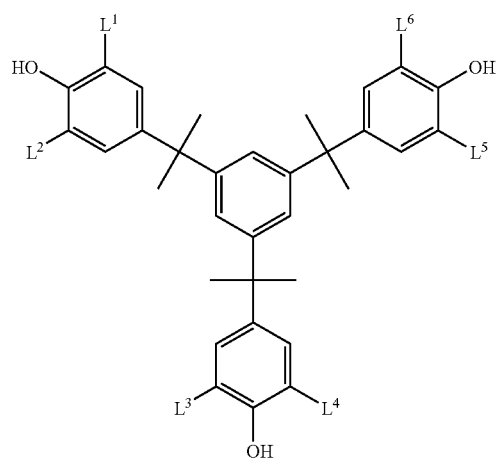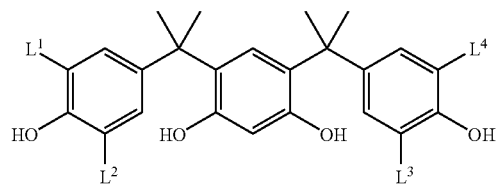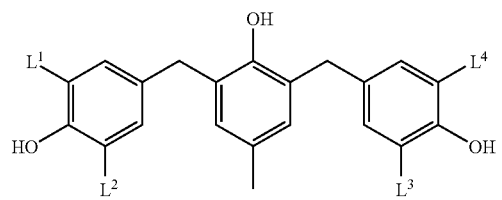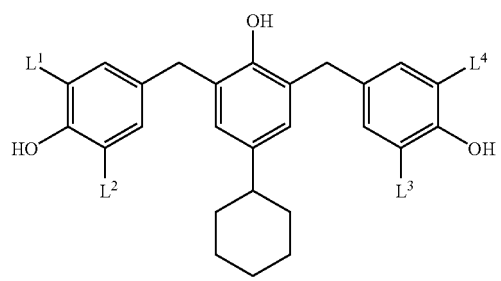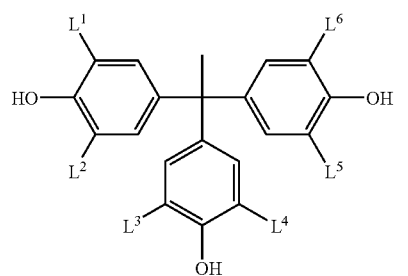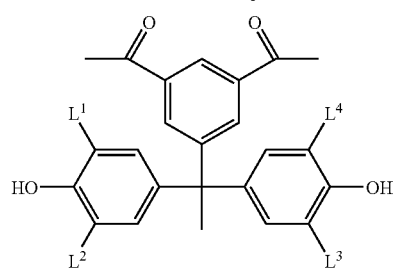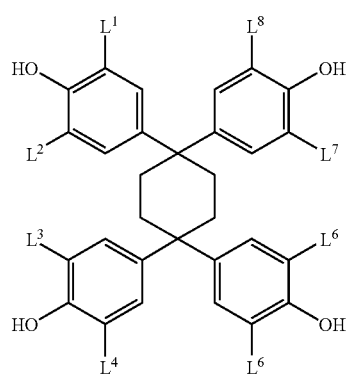

-continued
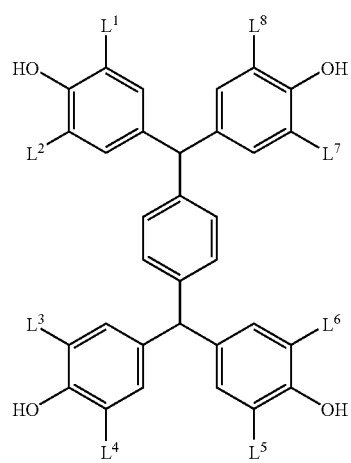
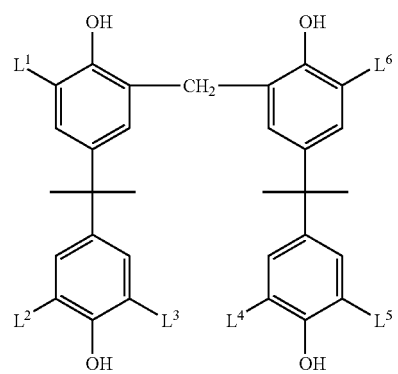
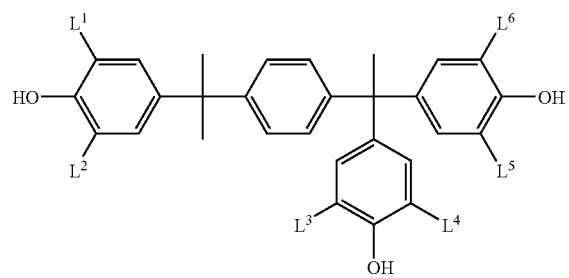
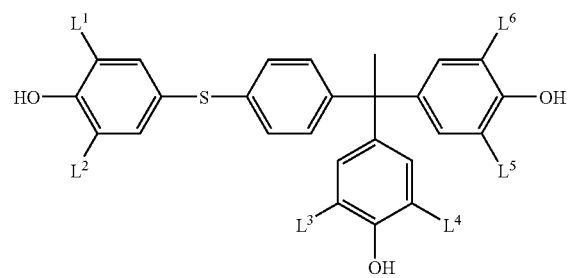
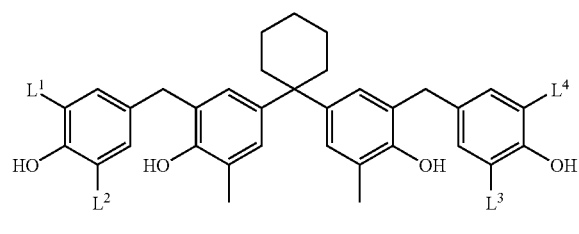
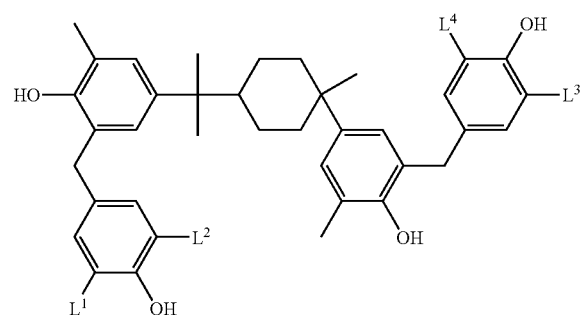
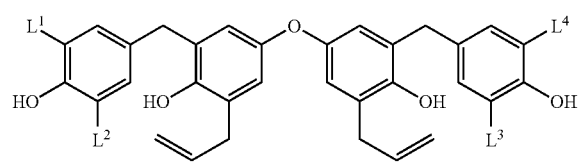
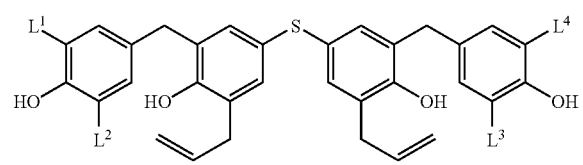
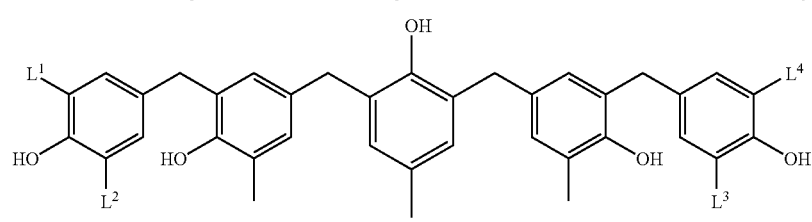

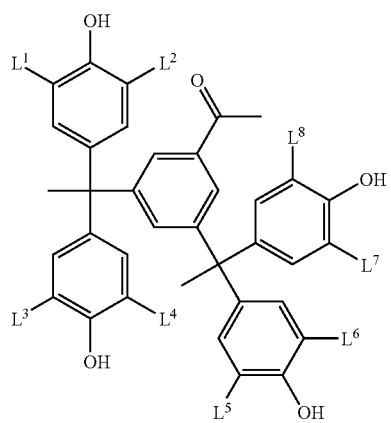
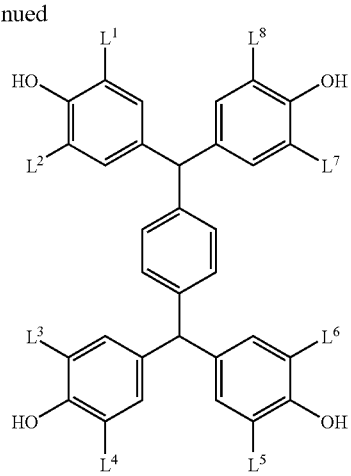

In the above formulae, $L^1$ to $L^8$, which may be the same or different, each represent a hydroxymethyl group, a methoxymethyl group, an ethoxymethyl group or an acyloxymethyl group.

As the acyloxymethyl group, those containing up to 6 carbon atoms are suitable, with examples including an acetyloxymethyl group, a propionyloxymethyl group, a butyryloxymethyl group and a valeryloxymethyl group.

The phenol derivatives having hydroxymethyl groups can be prepared by allowing their corresponding hydroxymethyl-free phenol compounds (or the compounds of the above formulae wherein $L^1$ to $L^8$ are hydrogen atoms) to react with formaldehyde in the presence of a basic catalyst. In order to prevent resin formation or gelation from occurring during the reaction, it is preferable to control the reaction temperature to 60° C. or below. More specifically, those derivatives can be synthesized according to the methods as disclosed in JP-A-6-282067 and JP-A-7-64285.

The phenol derivatives having alkoxymethyl groups can be prepared by allowing phenol compounds corresponding thereto, respectively, and containing hydroxymethyl groups to react with alcohol compounds in the presence of an acid catalyst. In order to prevent resin formation or gelation from occurring during the reaction, the reaction temperature is preferably controlled to 100° C. or below. More specifically, they can be synthesized in accordance with the method disclosed in EP-A1-632003.

The phenol derivatives having acyloxymethyl groups can be prepared by allowing phenol compounds corresponding thereto, respectively, and containing hydroxymethyl groups to react with carboxylic acid anhydrides under a neutral condition.

The thus prepared phenol derivatives containing hydroxymethyl groups, alkoxymethyl groups or acyloxymethyl groups are advantageous in point of storage stability. Of these derivatives, the phenol derivatives containing alkoxymethyl groups are preferred in particular from the viewpoint of storage stability.

The total number of hydroxymetyl, alkoxymethyl and acyloxymethyl groups contained in a phenol derivative is at least 2, and these groups may be bonded to benzene rings in a state of being concentrated on any of the rings or apportioned among all the rings. These phenol derivatives maybe used alone or as a combination of two or more thereof.

Other cross-linking agents suitable as Component (B-1) are phenol derivatives containing in each molecule one or two benzene rings to which at least two cross-linking groups selected from among a hydroxymethyl group, alkoxymethyl groups or acyloxymethyl groups are bonded, wherein the cross-linking groups including hydroxymethyl, alkoxymethyl or/and acyloxymethyl groups may be concentrated on one benzene ring or apportioned between two benzene rings. Of these phenol derivatives, the following are preferred in particular:

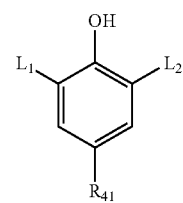
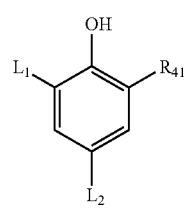
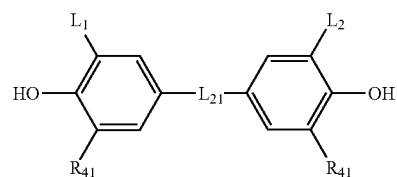

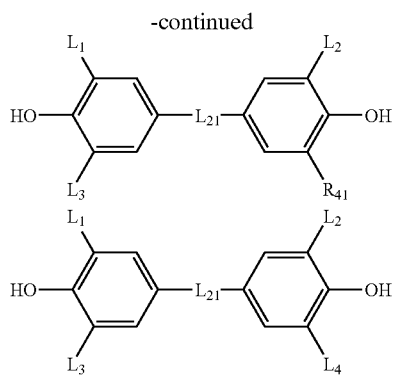

In the above formulae, $L_1$ to $L_4$ each have the same meaning as the foregoing $L^1$ to $L^8$ each.

$R_{41}$ represents a hydrogen atom, an alkyl group, or a cycloalkyl group, preferably a hydrogen atom, a 1-12C alkyl group or a 4-8C cycloalkyl group, and far preferably a hydrogen atom, a 1-8C alkyl group (e.g.,methyl, ethyl, propyl, i-propyl, butyl, t-butyl, hexyl, octyl), or a cyclohexyl group.

$L_{21}$ represents a single bond, an alkylene group or a cycloalkylene group, preferably a single bond, a 1-12C alkylene group or a 4-8C cycloalkylene group, and far preferably a single bond, a 1-8C alkylene group (e.g., methylene, ethylene, dimethylmethylene) or a 1,1-cyclohexylene group.

These phenol derivatives also can be synthesized in accordance with the same methods as mentioned above.

[2-2] Cross-Linking Agent of Present Component (B-2):

The cross-linking agent of Component (B-2) is a compound containing at least two, preferably 2 to 6, far preferably 4 to 6, groups represented by the foregoing formula (1) or (2).

In formula (1), $R_3$ represents a hydrogen atom, an alkyl group (preferably a 1-6C alkyl group, such as a methyl grop, an ethyl group or a butyl group), an alkylcarbonyl group (preferably a 2-6C alkylcarbonyl group, such as an acetyl group or a propionyl group). Of these groups, a hydrogen atom, a 1-3C alkyl group and a 2-3C alkylcarbonyl group, especially a hydrogen atom, a methyl group and an ethyl group, are preferred over the others. In formula (2), $R_3$ and $R_4$ are independent of each other, and each has the same meaning as $R_3$ in formula (3).

Examples of a skeletal structure suitable for the cross-linking agent of Component (B-2) include the structures of compounds or resins containing melamine skeletons, the structures of compounds or resins containing urea skeletons, the structures of compounds or resins containing imidazolidine skeletons and the structures of compounds or resins containing glycoluril skeletons.

When the cross-linking agent of Component (B-2) is a resin, the weight average molecular weight thereof is preferably from 800 to 50,000, far preferably from 1,000 to 30,000. When the agent is not a resin, on the other hand, the molecular weight thereof is preferably from 150 to 600, far preferably from 200 to 450.

Examples of a compound suitable as Component (B-2) are illustrated below, but these examples should not be construed as limiting the scope of the invention.

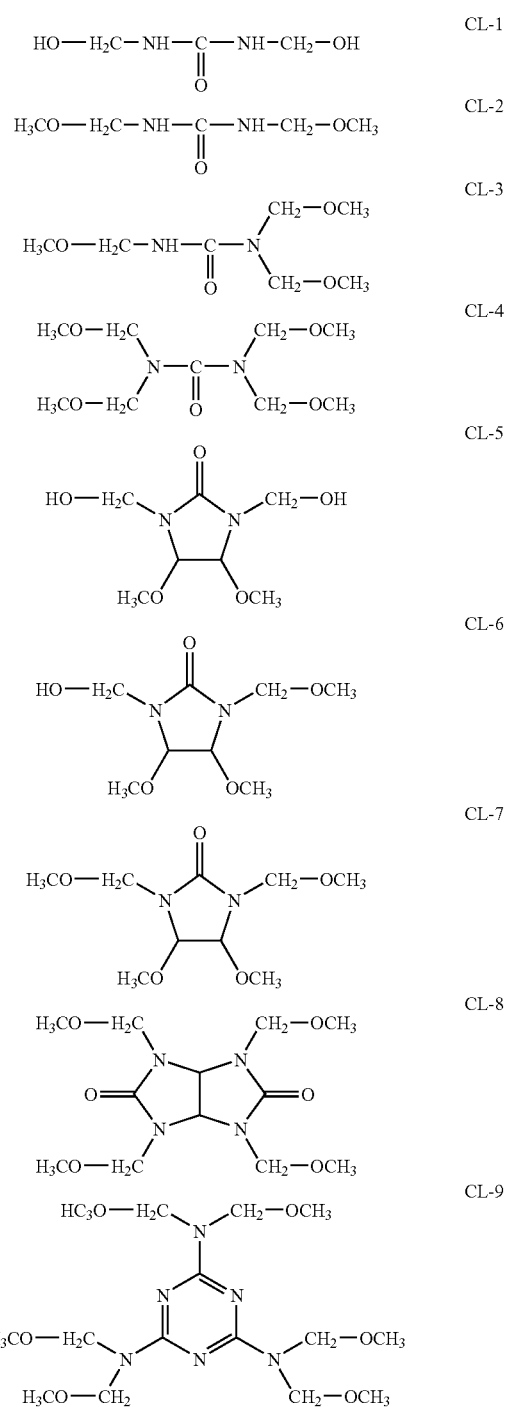

The compounds applicable to the present Component (B-2) may be used alone or as a mixture of two or more thereof.

It is appropriate that the cross-linking agent of Component (B-1) be contained in a proportion of 0.5 to 50% by weight, preferably 1 to 40% by weight, particularly preferably 2 to 35% by weight, to the total solids in the negative resist composition.

In addition, it is appropriate that the cross-linking agent of Component (B-2) be contained in a proportion of 0.5 to 50% by weight, preferably 1 to 40% by weight, particularly preferably 2 to 35% by weight, to the total solids in the negative resist composition.

Further, the suitable ratio between Component (B-1) and Component (B-2) used in the invention is from 3/97 to 97/3 by mole, preferably from 5/95 to 95/5 by mole, particularly preferably from 10/90 to 90/10 by mole.

[3] Compounds Capable of Producing Acids by Irradiation with Actinic Rays or Radiation (Component (C))

A wide variety of known acid generators can be used as acid generators of Component (C) in the invention. Examples of such acid generators include the compounds disclosed in JP-A-2002-6500, JP-A-2002-14470 and European Patent Nos. 1117004 and 1109066.

More specifically, onium salts such as diazonium salts, sulfonium salts and iodonium salts, organic halogeno-compounds, photo-acid generators having protective groups of o-nitrobenzyl type, iminosulfonate compounds, disulfone compounds, diazoketosulfonic acids, diazodisulfone compounds and oxime sulfonate compounds are suitable as Component (C) of the present negative composition.

Examples of an acid generator preferably used as Component (C) of the invention are illustrated below. Of course, these examples should not be construed as limiting the scope of the invention.

(I-1)

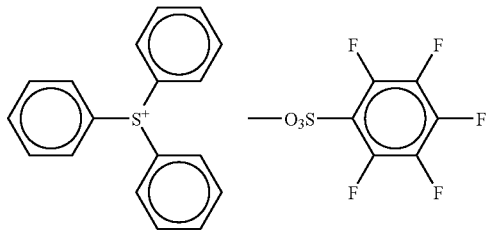

(I-2)

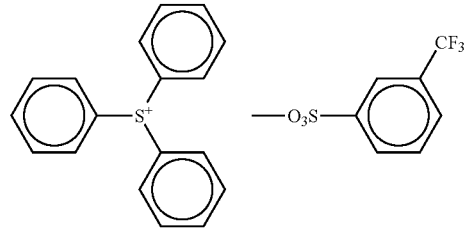

(I-3)

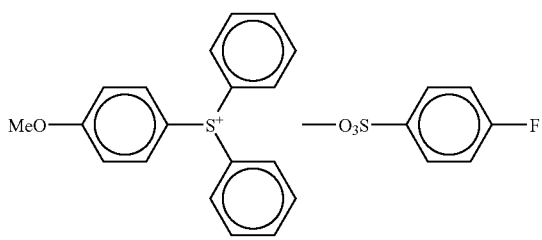

(I-4)

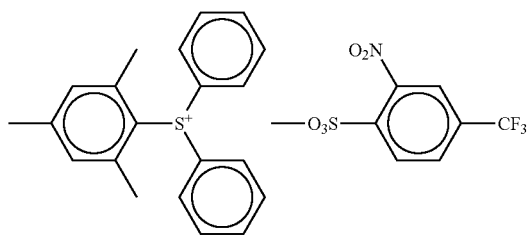

(I-5)

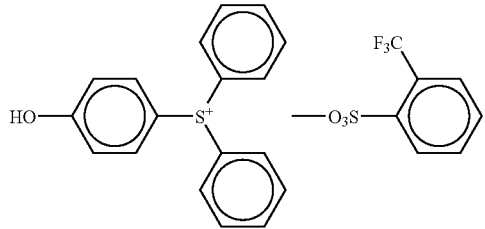

-continued
(I-6)
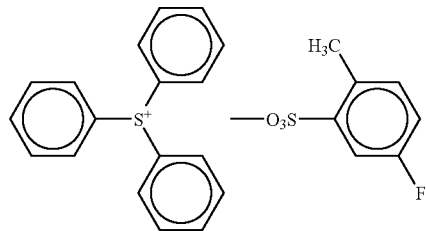
(I-7)
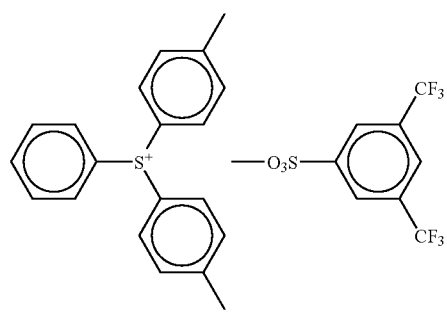
(I-8)
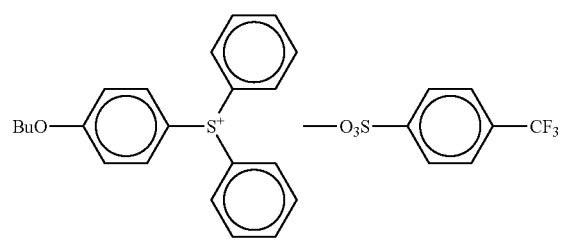
(I-9)
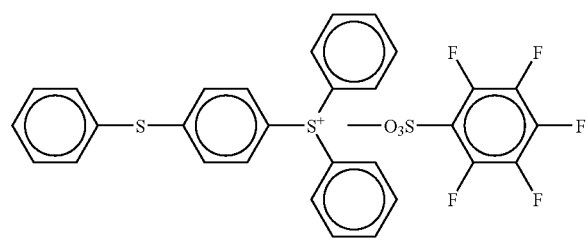
(I-10)
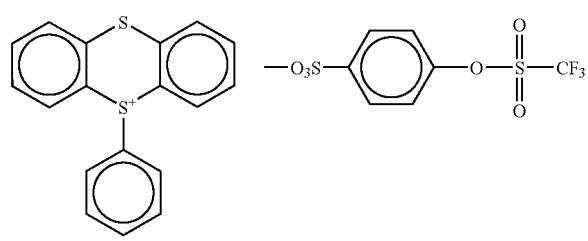

-continued
(I-11)
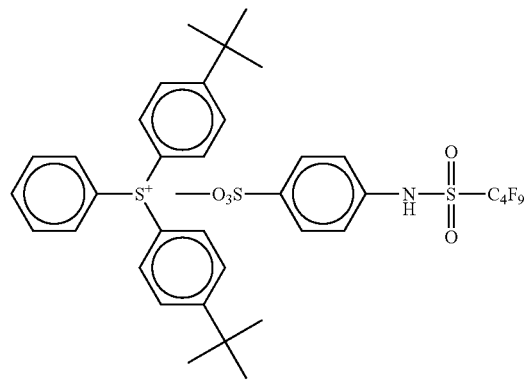
(I-12)
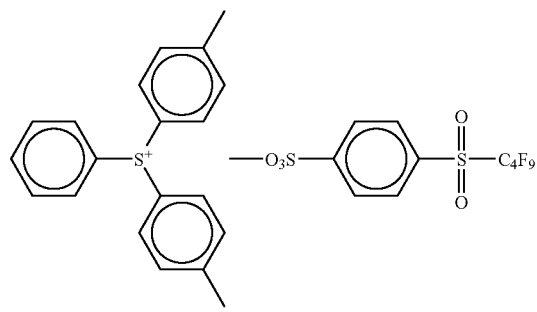
(I-13)
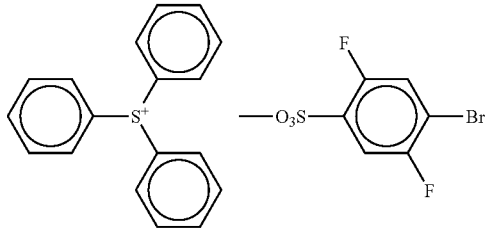
(I-14)
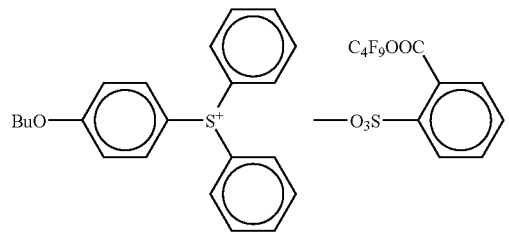
(II-1)
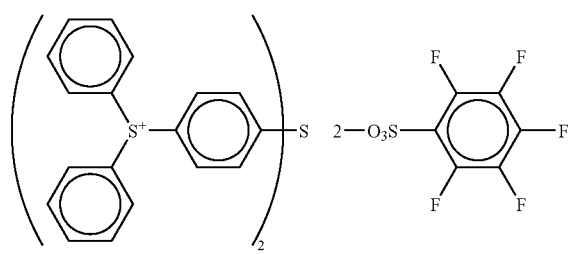

-continued
(II-2)
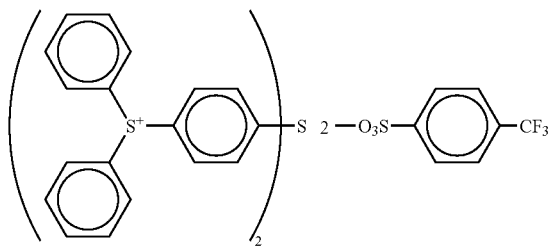
(II-3)
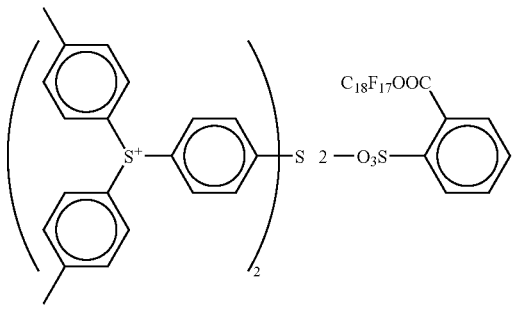
(II-4)
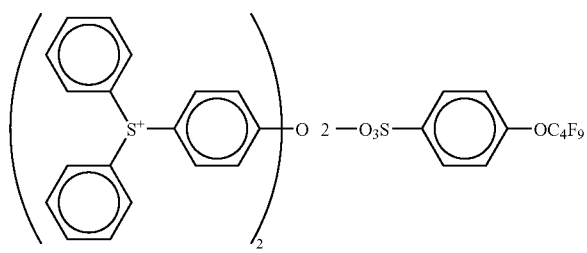
(II-5)
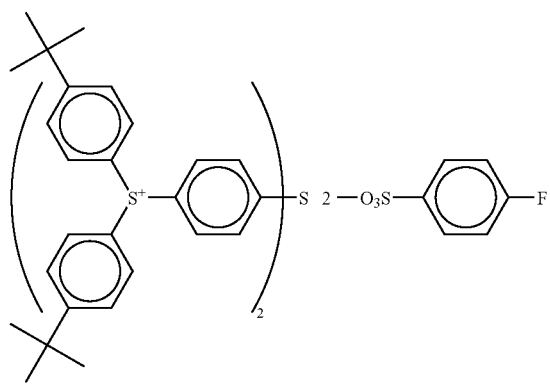
(III-1)
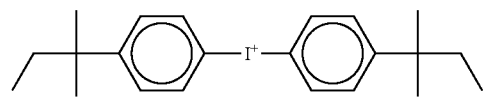
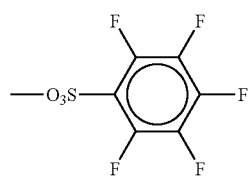

-continued
(III-2)
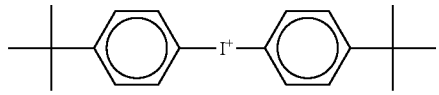
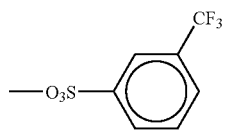
(III-3)
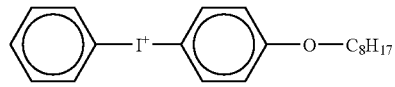
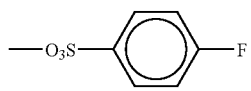
(III-4)
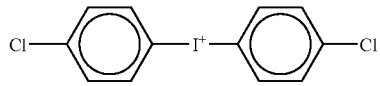
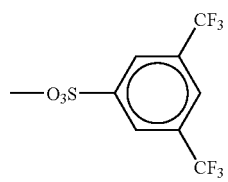
(III-5)
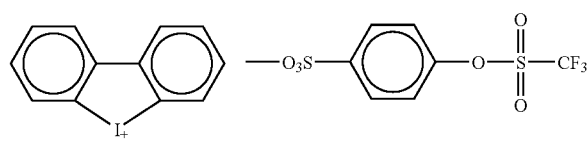
(III-6)
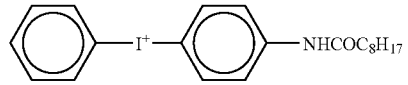
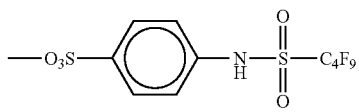
(III-7)
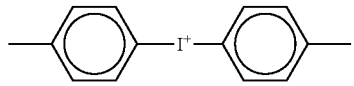
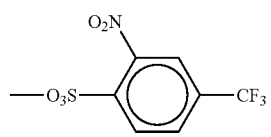

-continued
(III-8)
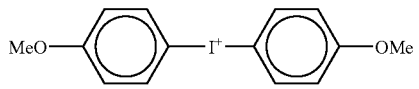
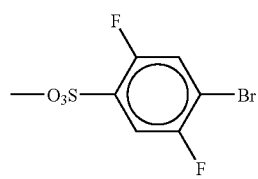
(PAG3-1)
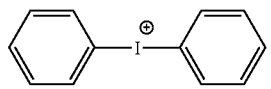
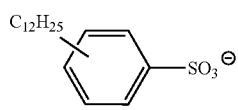
(PAG3-2)
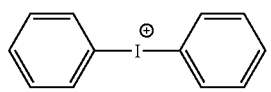
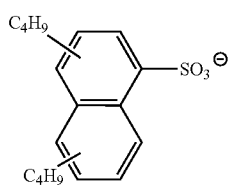
(PAG3-4)
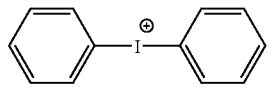
(PAG3-5)
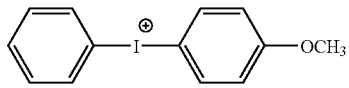
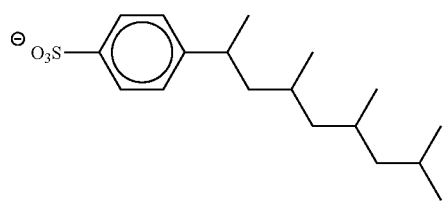
(PAG3-7)
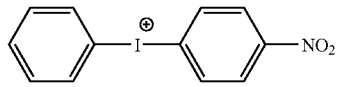
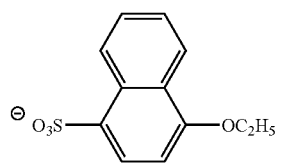

-continued
(PAG3-9)
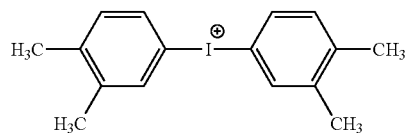
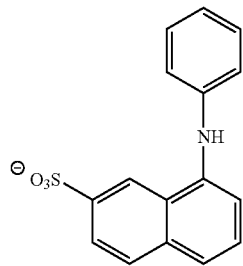
(PAG3-10)
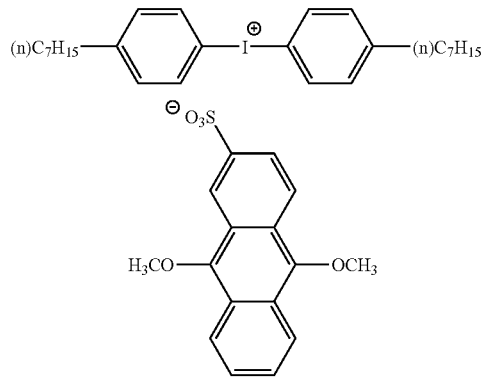
(PAG3-11)
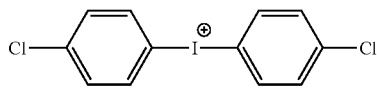
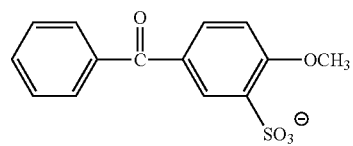
(PAG3-12)
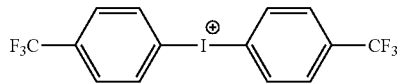
(PAG3-13)
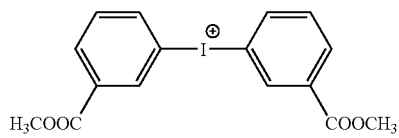
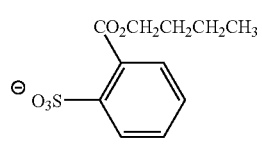

-continued
(PAG3-14)
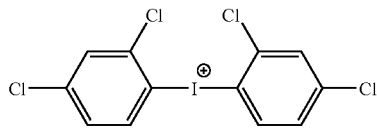
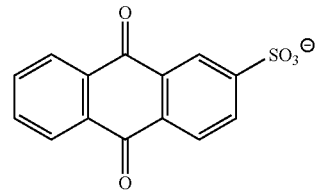
(PAG3-15)
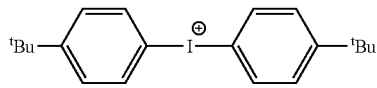
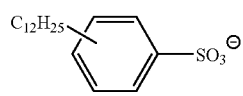
(PAG3-16)
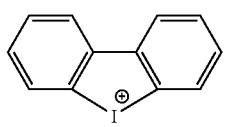
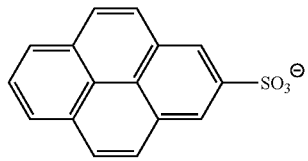
(PAG3-17)
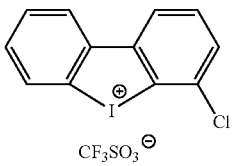
(PAG3-19)
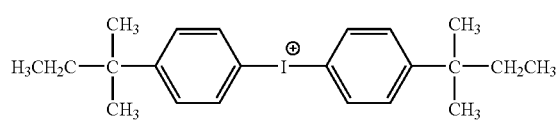
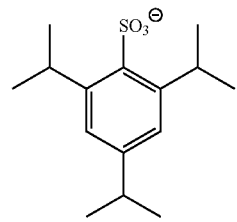
(PAG3-20)
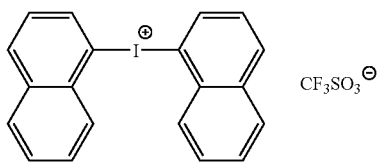

-continued
(PAG3-21)
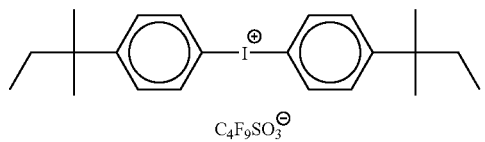
(PAG3-23)
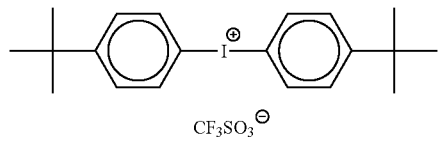
(PAG3-24)
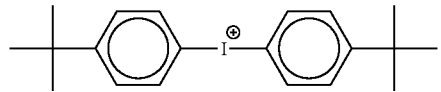
(PAG3-25)
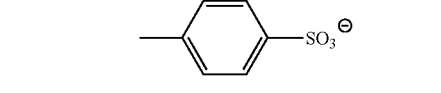
(PAG4-1)
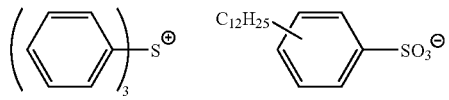
(PAG4-2)
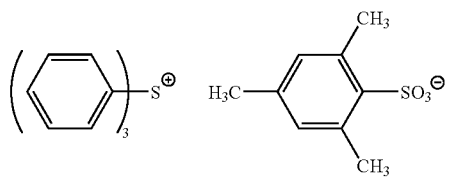
(PAG4-4)
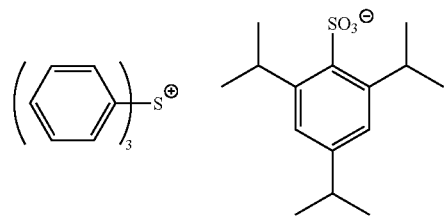
(PAG4-5)
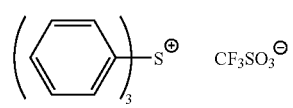
(PAG4-6)
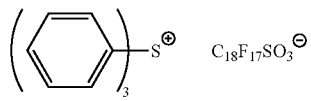

-continued
(PAG4-8)
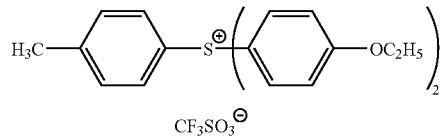
(PAG4-9)
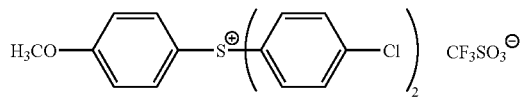
(PAG4-12)
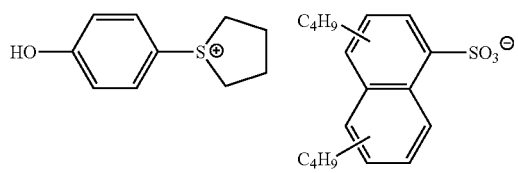
(PAG4-13)
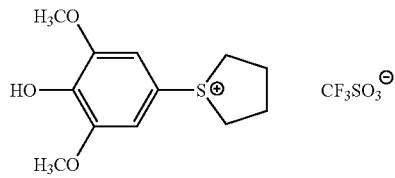
(PAG4-17)
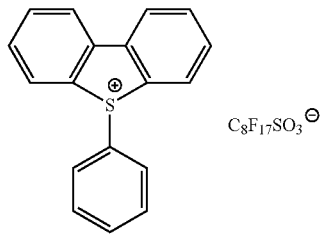
(PAG4-20)
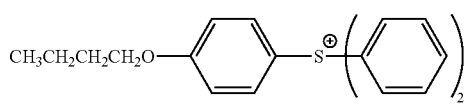
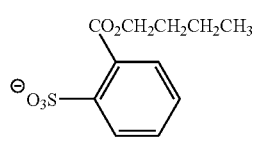
(PAG4-22)
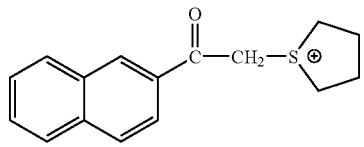
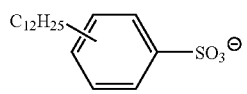

-continued
(PAG4-25)
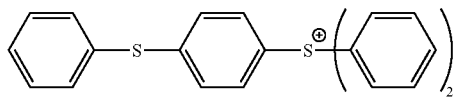
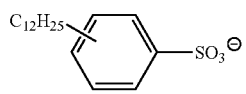
(PAG4-26)
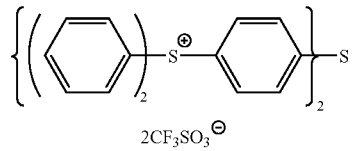
(PAG4-27)
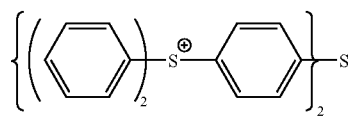
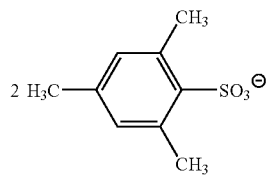
(PAG4-28)
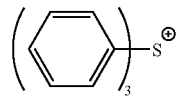
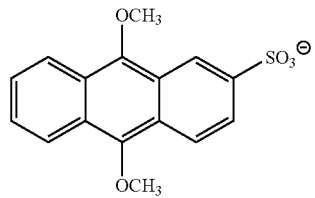
(PAG4-29)
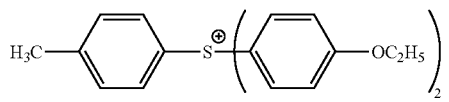
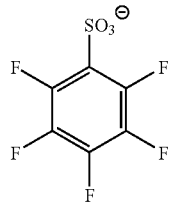
(PAG4-30)
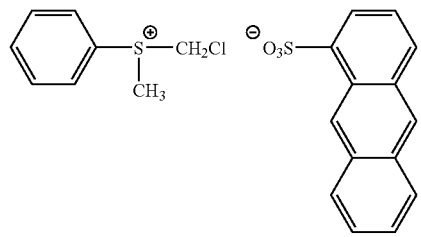

-continued
(PAG4-31)
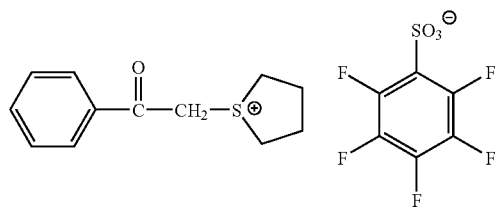
(PAG4-32)
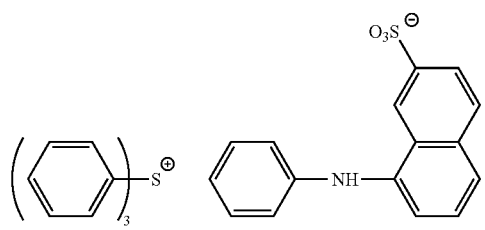
(PAG4-33)
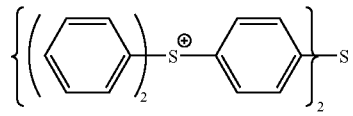
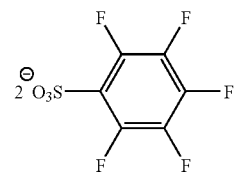
(PAG4-34)
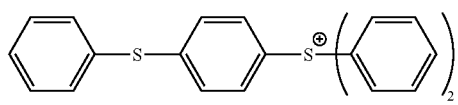
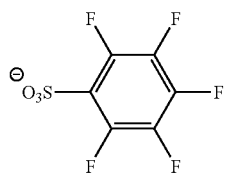
(PAG4-35)
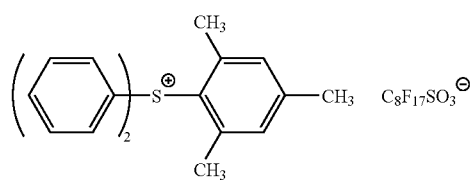
(PAG4-36)
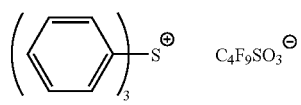

-continued
PAG4-37
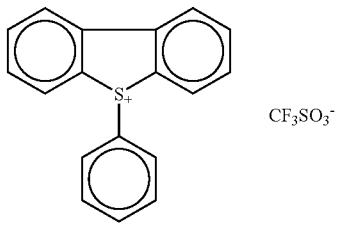
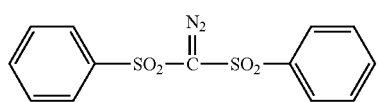
J-1
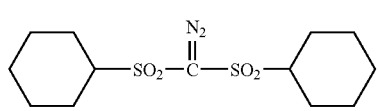
J-2
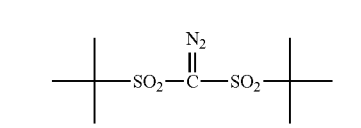
J-3
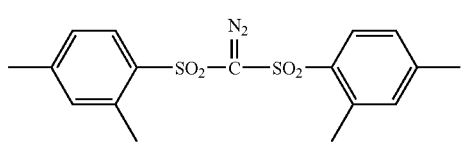
J-4
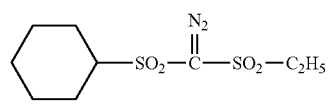
J-5
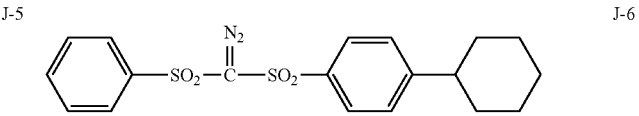
J-6
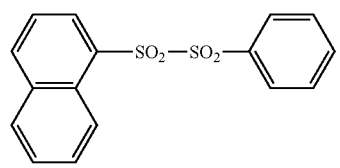
J-7
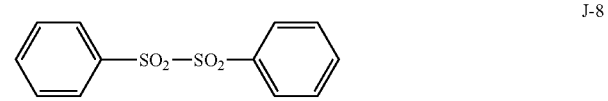
J-8
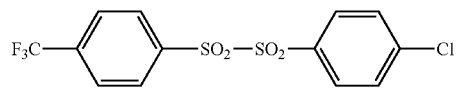
J-9
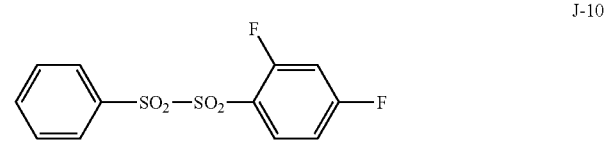
J-10
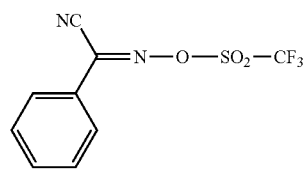
J-11
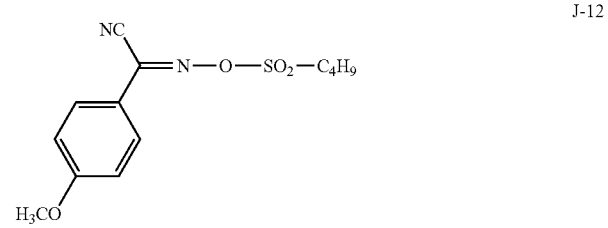
J-12
J-13
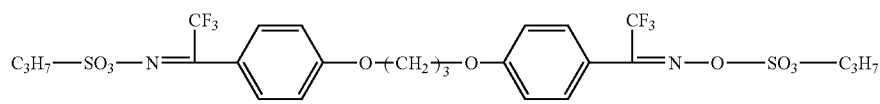

-continued
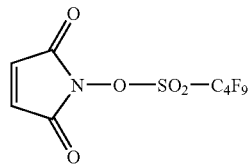
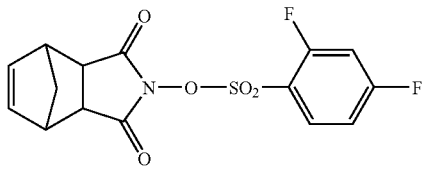
J-14
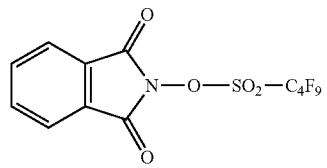
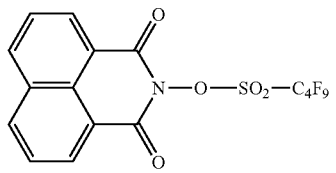
J-15
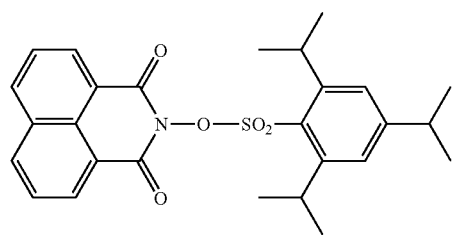
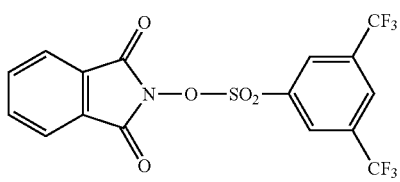
J-16
J-17
J-18
J-19
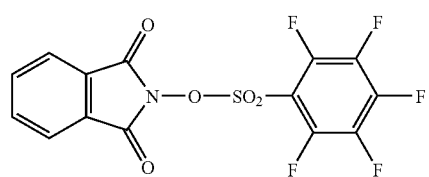
J-20
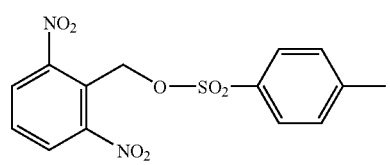
J-21
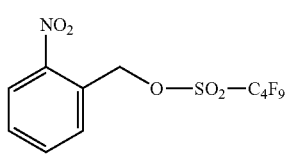
J-22
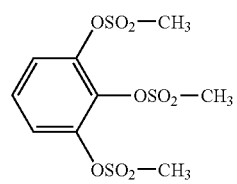
J-23
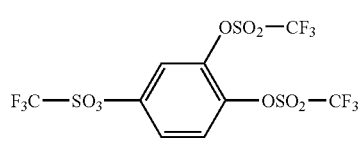
J-24
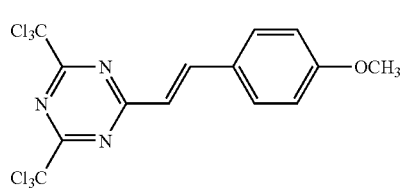
J-25

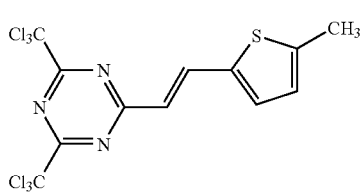
J-26

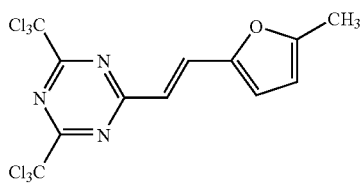
J-27

The suitable content of acid generators used as Component (C) in the invention is from 1 to 30% by weight, preferably from 2 to 20% by weight, particularly preferably from 3 to 18% by weight, of the total solids in the negative resist composition.

In the invention, the acid generators of Component (C) may be used alone or as a mixture of two or more thereof.

[4] Nitrogen-Containing Basic Compounds (Component (D))

It is preferable that the present composition further contains a nitrogen-containing basic compound. The nitrogen-containing basic compounds which can be used to advantage are compounds more strongly basic than phenol.

Examples of a chemical setting suitable for such a basic compound include structures represented by the following formulae (A) to (E). The formulae (B) to (E) each may be a part of cyclic structure.

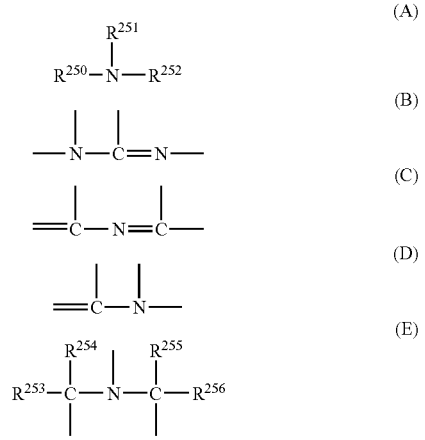

Herein, $R^{250}$, $R^{251}$ and $R^{252}$ which may be the same or different, each represent a hydrogen atom, a 1-6C alkyl group, a 1-6C aminoalkyl group, a 1-6C hydroxyalkyl group, or a 6-20C substituted or unsubstituted aryl group. Further, $R^{251}$ and $R^{252}$ may combine to form a ring.

$R^{253}$, $R^{254}$, $R^{255}$ and $R^{256}$, which may be the same or different, each represent a 1-6C alkyl group.

The basic compounds preferred by far in the invention are nitrogen-containing basic compounds which have in each molecule at least two nitrogen atoms differing in chemical setting, and those used to particular advantage are compounds which each have both substituted or unsubstituted amino group and nitrogen-containing cyclic structure, or an alkylamino group.

Suitable examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a subsituted or unsubstituted piperazine, a subsituted or unsubstituted aminomorpholine, and a substituted or unsubstituted aminoalkylmorpholine. Examples of substituents suitable for the above-recited compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of basic compounds preferred in particular include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, these examples should not be construed as limiting the scope of the basic compounds usable in the invention.

Those nitrogen-containing basic compounds are used alone or as combinations of two or more thereof.

It is appropriate that the ratio of the acid generator and the nitrogen-containing basic compound used in the present composition, the (acid generator)/(nitrogen-containing basic compound) ratio, be from 2.5 to 300 by mole. When the ratio is lower than 2.5 by mole, decrease in sensitivity and lowering of resolution occur in some cases. When the ratio is higher than 300 by mole, on the other hand, the thickening of resist patterns during a period from the completion of exposure to the start of heat treatment becomes serious and the resolution is lowered in some cases. The (acid generator)/(nitrogen-containing basic compound) ratio (by mole) is preferably from 5.0 to 200, far preferably from 7.0 to 150.

The suitable proportion of Component (D) used in the invention to the total solids in the negative resist composition is from 0.01 to 10% by weight, preferably from 0.03 to 5% by weight, particularly preferably from 0.05 to 3% by weight.

In the invention, the nitrogen-containing basic compounds of Component (D) may be used alone or as mixtures of two or more thereof.

[5] Other Components

The present negative resist composition can further contain dyes, solvents, surfactants, photo-decomposable basic compounds and photo-base generators, if needed.

(5)-1 Dyes

Dyes suitably used in the present composition are fat dyes and basic dyes. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

(5)-2 Solvents

The aforementioned ingredients to constitute the present composition are dissolved in an appropriate solvent and coated on a substrate. Examples of a solvent usable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as mixtures of two or more thereof.

(5)-3 Surfactants

Surfactants can also be added to the solvents as recited above. Examples of such surfactants include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene-sorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate); fluorine- or silicon-containing surfactants, such as Eftop EF301, EF303 and EF352 (produced by Shin-Akita Kasei K.K.), Megafac F171 and F173 (produced by Dainippon Ink &Chemicals, Inc.), Florad FC430 and FC431 (produced by Sumitomo 3M, Inc.), Asahi-Gard AG710, Surflon S-382, SC101, SC102, SC103, SC104, SC105 and SC106 (produced by Asahi Glass Co., Ltd.), and Troysol S-366 (produced by Troy Chemical Industries, Inc.); organosiloxane polymer, KP-341 (produced by Shin-Etsu Chemical Industry Co., Ltd.); and acrylic or methacrylic acid-based (co)polymers, Polyflow No. 75 and No. 95 (produced by KyoeiSha Yushi Kagaku Kogyo K.K.). These surfactants are used in an amount of generally at most 2 parts by weight, preferably at most 1 parts by weight, per 100 parts by weight of the total solids in the present composition.

Those surfactants may be added alone or as combinations of two or more thereof.

Additionally, it is preferable that the surfactant used in the present composition is any of surfactants containing at least one fluorine atom or/and at least one silicon atom per molecule (namely, any of fluorine-containing surfactants, silicon-containing surfactants and surfactants containing both fluorine and silicon atoms), or a combination of at least two of these surfactants.

Examples of such surfactants include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine- or silicon-containing surfactants, such as Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.) and Troysol S-366 (produced by Troy Chemical Industries, Inc.). In addition, organosiloxane polymer, KP-341 (produced by Shin-Etsu Chemical Industry Co., Ltd.) can be also sed as a silicon-containing surfactant.

In addition to known surfactants as recited above, specific polymers containing fluorinated aliphatic groups can be used as surfactants in the invention. Such polymers contain fluorinated aliphatic groups derived from fluorinated aliphatic compounds synthesized by a telomerization method (telomer method) or an oligomerization method (oligomer method). These fluorinated aliphatic compounds can be synthesized by the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly(oxyalkylene)methacrylates, wherein the fluorinated aliphatic group-containing units may be distributed randomly or in blocks. Examples of those poly(oxyalkylene) groups include a poly(oxyethylene) group, a poly(oxypropylene) group and a poly(oxybutylene) group. In addition, the poly(oxyalkylene) groups maybe units containing alkylene groups differing in chain length in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly(oxyalkylene) acrylates (or methacrylates) may be binary copolymers or at least ternary copolymers prepared by copolymerizing at least two different kinds of fluorinated aliphatic group-containing monomers and at least two different kinds of poly (oxyalkylene) acrylates (or methacrylates) at a time.

Examples of a fluorinated aliphatic group-containing polymer commercially available as surfactant include Megafac F178, F-470, F-473, F-475, F-476 and F-472 (produced by Dainippon Ink & Chemicals, Inc.). Additional examples of a fluorinated aliphatic group-containing polymer include a copolymer of $C_6F_{13}$ group-containing acrylate (or methacrylate) and poly(oxyalkylene)acrylate (or methacrylate), a terpolymer of $C_6F_{13}$ group-containing acrylate (or methacrylate), poly(oxyethylene)acrylate (or methacrylate) and poly(oxypropylene)acrylate (or methacrylate), a copolymer of $C_8F_{17}$ group-containing acrylate (or methacrylate) and poly(oxyalkylene)acrylate (or methacrylate), and a terpolymer of $C_8F_{17}$ group-containing acrylate (or methacrylate), poly(oxyethylene)acrylate (or methacrylate) and poly(oxypropylene)acrylate (or methacrylate).

It is appropriate that these surfactants be used in a proportion of 0.0001 to 2% by weight, preferably 0.001 to 1% by weight, to the total ingredients (exclusive of a solvent) in the negative resist composition.

(5)-4 Photo-Decomposable Basic Compounds

To the present composition can further be added the ammonium salts disclosed in JP-A-7-28247, European Patent No. 616258, U.S. Pat. No. 5,525,443, JP-A-9-127700, European Patent No. 762207 and U.S. Pat. No. 5,783,354, such as tetramethylammonium hydroxide, tetra-n-butylammonium hydroxide and betaine, or the compounds lowering their basicity by undergoing exposure (photo bases) as disclosed in JP-A-5-232706, JP-A-6-11835, JP-A-6-242606, JP-A-6-266100, JP-A-7-333851, JP-A-7-333844, U.S. Pat. No. 5,663,035 and European Patent No. 677788.

(5)-5 Photo-Base Generators

Examples of a photo-base generator which can be added to the present composition include the compounds disclosed in JP-A-4-151156, JP-A-4-162040, JP-A-5-197148, JP-A-5-5995, JP-A-6-194834, JP-A-8-146608, JP-A-10-83079 and European Patent No. 622682. More specifically, 2-nitrobenzylcarbamate, 2,5-dinitrobenzylcyclohexylcarbamate, N-cyclohexyl-4-methylphenylsulfonamide and 1,1-dimethyl-2-phenylethyl-N-isopropylcarbamate can be used suitably as photo-base generator. Such a photo-base generator is added for the purpose of improvement in resist pattern profile.

The present negative resist composition is coated on a substrate and forms a thin film. It is appropriate that this coating film have a thickness of from 0.05 to 4.0 μm.

In the invention, commercial inorganic or organic anti-reflecting coating can be used, if needed. Further, an anti-reflecting film formed by coating can be used for a lower layer of the resist coating.

As an anti-reflecting coating which forms a lower layer of the resist coating, both inorganic and organic coatings can be used. The anti-reflecting coating of inorganic type is formed from titanium, titanium dioxide, titanium nitride, chromium oxide, carbon or amorphous silicon, and that of organic type is formed from a light absorbing agent and a polymeric material. The formation of the former coating requires equipment, such as a vacuum evaporator, a CVD apparatus or a sputtering apparatus. Examples of an organic anti-reflecting coating include the anti-reflecting coating disclosed in JP-B-7-69611 which contains a condensate produced from a diphenylamine derivative and formaldehyde-modified melamine resin, an alkali-soluble resin and a light absorbing agent, the anti-reflecting coating disclosed in U.S. Pat. No. 5,294,680 which is formed from a product of reaction between a maleic anhydride copolymer and a light absorbing agent of diamine type, the anti-reflecting coating disclosed in JP-A-6-118631 which contains a resin binder and a thermally cross-linking agent of methylolmelamine type, the anti-reflecting coating disclosed in JP-A-6-11865 which is formed from an acrylic resin containing carboxylic acid groups, epoxy groups and light-absorbing groups in the same molecule, the anti-reflecting coating disclosed in JP-A-8-87115 which contains methylolmelamine and a light absorbing agent of benzophenone type, and the anti-reflecting coating disclosed in JP-A-8-179509 which is formed from polyvinyl alcohol resin to which a low molecular light-absorbing agent is added.

As to the organic anti-reflecting coating, it is also possible to use commercially available ones, such as DUV30 series and DUV40 series produced by Brewer Science Inc., and AR-2, AR-3 and AR-5 produced by Shipley Co., Ltd.

The process of forming patterns on a resist film for fabrication of high-precision integrated circuit elements includes sequentially the steps of coating the present negative resist composition on a substrate (e.g., a silicon-silicon dioxide coated substrate, a glass substrate, an ITO substrate, a quartz-chromium oxide coated substrate) directly or via one of the aforementioned anti-reflecting coatings which is provided in advance on such a substrate as recited above, irradiating the resist coating with X-rays, electron beams or ionic beams, and heating, developing, rinsing and drying the irradiated resist coating. In this process, resist patterns of good quality can be formed.

As a developer for the present negative resist composition, an aqueous solution of alkali can be used. Examples of an alkali usable therein include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butyllamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide and choline, and cyclic amines such as pyrrole and piperidine. To the aqueous alkali solution, alcohol, e.g., isopropyl alcohol, and a nonionic surfactant may further be added in appropriate amounts.

Of those developers, a solution of quaternary ammonium salt, preferably tetramethylammonium hydroxide or choline, is advantageous over the others.

EXAMPLES

The invention will now be illustrated in more detail by reference to the following examples, but these examples should not be construed as limiting the scope of the invention.

1. Synthesis Examples of Constituent Elements (1) Alkali-Soluble Resin of Component (A)

Synthesis Example 1

Synthesis of Resin (29)

In 30 ml of 1-methoxy-2-propanol, 3.9 g (0.024 mole) of 4-acetoxystyrene and 0.8 g (0.006 mole) of 4-methoxystyrene were dissolved. While stirring this solution at 70° C. in a stream of nitrogen, 50 mg of a polymerization initiator, 2,2'-azobis(2,4-dimethylvaleronitrile) (V-65, trade name, a product of Wako Pure chemical Industries, Ltd.), and a 70 ml of 1-methoxy-2-propanol solution containing 9.1 g (0.056 mole) of 4-acetoxystyrene and 1.9 g (0.014 mole) of 4-methoxystyrene were added thereto over a 2-hour period. After a 2-hour lapse, 50 mg of the initiator was further added and the reaction was continued for additional 2 hours. Thereafter, the temperature of the reaction solution was raised to 90° C. and the stirring was continued for additional one hour. The resulting reaction solution was cooled to room temperature, and then poured into 1L of ion-exchanged water with vigorous stirring. Thus, a white resin was precipitated. The resin obtained was dried, and then dissolved in 100 mL of methanol. To this methanol solution, 25% tetramethylammonium hydroxide was added to hydrolyze the acetoxy groups in the resin, and therefrom a white resin was precipitated by neutralization with an aqueous solution of hydrochloric acid. The resin precipitated was washed with ion-exchanged water, and then dried under reduced pressure. Thus, 11.6 g of the present Resin (29) was obtained. In the molecular weight measurement by GPC, it was found that this resin had the weight average molecular weight (Mw) of 9,200, calculated in terms of polystyrene, and the dispersion degree (Mw/Mn) of 2.2.

Other resins used as the present Component (A) were synthesized in similar manners to the above.

(2) Cross-Linking Agent of Component (B-1)

Synthesis of [HM-1]:

1-[α-Methyl-α-(4-hydroxyphenyl)ethyl]-4-[(α,α-bis(4-hydroxyphehyl)ethyl]benzene in an amount of 20 g was added to a 10% aqueous solution of potassium hydroxide and dissolved in the solution by stirring. While stirring this solution, 60 ml of a 37% aqueous solution of formaldehyde was added little by little thereto over a 1-hour period at room temperature. The stirring was continued for additional 6 hours, and then the resulting reaction solution was poured into a dilute aqueous solution of sulfuric acid. The precipitate thus formed was filtered off, washed thoroughly, and then re-precipitated from 30 ml of methanol. Thus, 20 g of a hydroxymethyl-containing phenol derivative [HM-1] represented by the following structural formula was obtained in a state of white powder. The purity of this powder was found to be 92% by liquid chromatography.

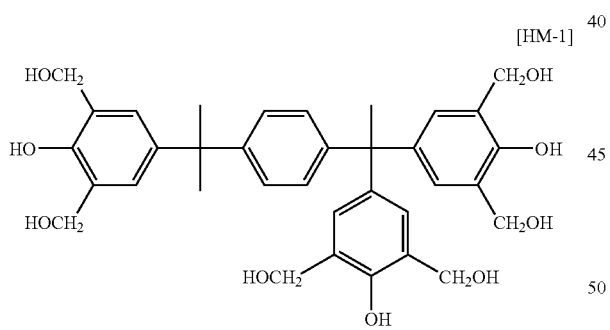

[HM-1]

Synthesis of [MM-1]:

To one liter of methanol, 20 g of the hydroxylmethyl-containing phenol derivative [HM-1] obtained in the foregoing Synthesis was added, and heated with stirring to prepare a solution. This solution was admixed with 1 ml of conc. sulfuric acid and heated for 12 hours under reflux. At the conclusion of the reaction, the reaction solution was cooled, and admixed with 2 g of potassium carbonate. This admixture was concentrated to the full, and there to ethyl acetate was added. The resulting solution was washed with water, concentrated and evaporated to dryness. Thus, the intended methoxymethyl-containing phenol derivative [MM-1] represented by the following structural formula was obtained as a white solid in an amount of 22 g. The purity of this produce was found to be 90% by liquid chromatography.

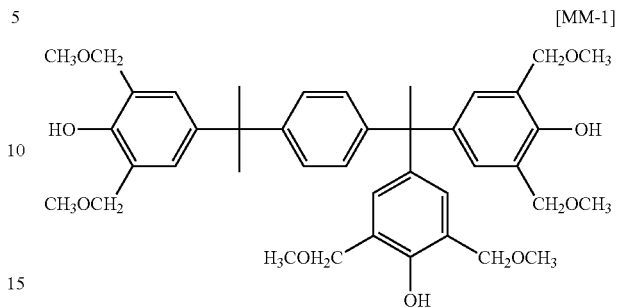

[MM-1]

In manners similar to the above, the phenol derivatives illustrated below were synthesized.

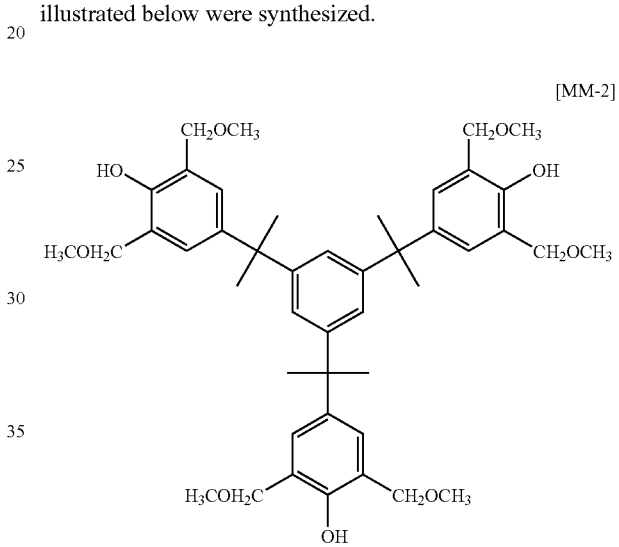

[MM-2]

[MM-3]

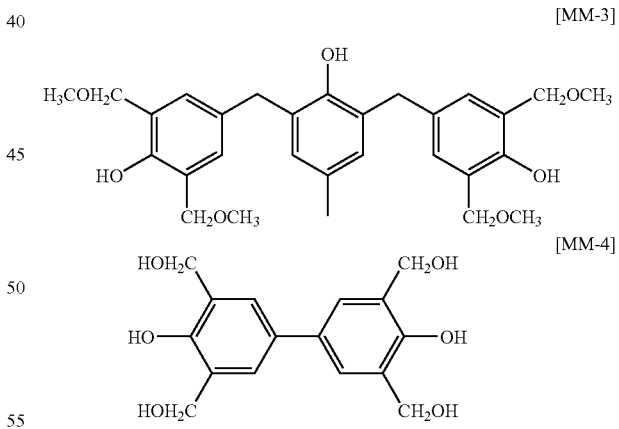

[MM-4]

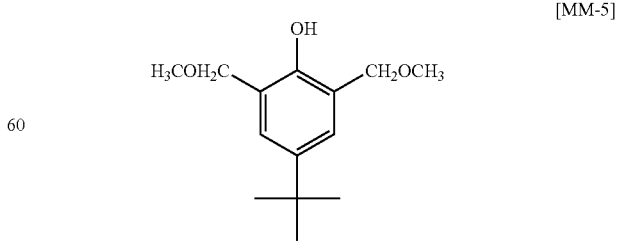

[MM-5]

(3) Acid Generator of Component (C)

Synthesis Example 1

Synthesis of Acid Generator (I-1)

AgBF$_4$ in an amount of 16.4 g was mixed with 150 ml of acetonitrile. Thereto, a solution containing 16.0 g of phenacyl bromide and 12.4 g of di-n-butyl sulfide in 50 ml of acetonitrile was added over a period of 30 minutes. The resulting admixture was stirred for one night at room temperature. The reaction solution obtained was concentrated to yield a powder. This powder was washed with diisopropyl ether to yield 27 g of phenacyldi-n-butylsulfonium tetrafluoroborate.

A 10 g portion of the phenacyldi-n-butylsulfonium tetrafluoroborate was dissolved in 200 ml of methanol, admixed with 10.1 g of potassium nonafluorobutanesulfonate, and stirred for 1 hour at room temperature. The reaction solution thus prepared was admixed with 500 ml of chloroform, and washed with two 300 ml portions of distilled water. The organic layer was concentrated to yield 9.8 g of Acid Generator (I-1).

Other compounds used as Compound (C) were also synthesized in similar manner to the above.

Additionally, all cross-linking agents used as Component (B-2) in the following examples were commercially available chemicals (produced by Sanwa Chemical Co., Ltd.). 2. Examples Example 1

(1) Preparation and Coating of Negative Resist Composition
Component (A): Resin (29) 0.727 g
Component (B-1): Cross-linking agent MM-1 0.10 g
Component (B-2): Cross-linking agent CL-9 0.10 g
Component (C): Acid generator I-1 0.07 g
Component (D): D-1 0.003 g The composition described above was dissolved in a mixture of 7.5 g of propylene glycol monomethyl ether acetate and 1.5 g of propylene glycol monomethyl ether, admixed with 0.001 g of Megafac F176 (referred to as "W-1" hereinafter, a surfactant produced by Dai-Nippon Ink & Chemicals, Inc.), and made into a solution. This solution was finely filtered with a membrane filter having a 0.1-μm pore diameter to prepare a resist solution.

The resist solution thus obtained was coated on a 6-inch wafer by means of a spin coater Mark 8 (made by TOKYO ELECTRON LIMITED), and dried on a 110° C. hot plate for 90 seconds to form a 0.30 μm-thick resist film.

(2) Formation of Negative Resist Patterns
The resist film formed in the aforementioned manner was irradiated with an electron-beam drawing apparatus HL750 (made by Hitachi, Ltd., acceleration voltage: 50 KeV,). After irradiation, the resist film was heated on a 110° C. hot plate for 90 seconds, dipped in a 2.38 weight % aqueous solution of tetramethylammonium hydroxide for 60 seconds, rinsed with water for 30 seconds, and then dried. The sensitivity, resolution, profile shape and line edge roughness of the patterns formed were evaluated by the following methods respectively.

(2-1) Sensitivity
Profiles of the patterns formed were observed under a scanning electron microscope (S-4300, made by Hitachi, Ltd.). The sensitivity is defined in terms of the exposure of electron beams required to resolve 0.15-μm patterns (line: space=1:1).

(2-2) Resolution
The limiting resolution (capable of resolving lines and spaces separately) under the exposure providing the sensitivity defined above is taken as the resolution.

(2-3) Profile Shape
The profile shapes of 0.15-μm line patterns formed under the exposure providing the sensitivity defined above were observed with a scanning electron microscope (S-4300 made by Hitachi, Ltd.), and rated on a 1-to-3 scale, namely as a rectangular, somewhat taper or taper shape.

(2-4) Line Edge Roughness
The line width measurement of a 0.15-μm line pattern formed under the exposure providing the sensitivity defined above was carried out at 30 points arbitrarily chosen from a 50-μm segment of the line pattern in the length direction, and the dispersion in the measured values was evaluated in terms of 3σ.

The evaluation results on the negative resist prepared in Example 1 were all good, and more specifically, the sensitivity was 6.0 μC/cm$^2$, the resolution was 0.11 μm, the pattern profile was rectangular, and the line edge roughness was 4.5 nm.

Examples 2 to 12

Resist compositions were prepared, and subjected to negative patterning operations in the same manners as in Example 1, except that the ingredients set forth in Table 1 were used. The evaluation results are shown in Table 2.

Comparative Example 1

A resist composition was prepared, and subjected to negative patterning operations in the same manners as in Example 1, except that the cross-linking agent used was Component (B-1) alone as shown in Table 1. The evaluation results are shown in Table 2.

Comparative Example 2

A resist composition was prepared, and subjected to negative patterning operations in the same manners as in Example 1, except that the cross-linking agent used was Component (B-2) alone as shown in Table 1. The evaluation results are shown in Table 2.

TABLE 1

| Example | Component (A) Resin | Component (B-1) Cross-linking agent | Component (B-2) Cross-linking agent | Component (C) Acid generator | Component (D) Nitrogen-containing basic compound |
|---|---|---|---|---|---|
| 1 | (29) Mw = 9200<br>0.727 g<br>x/y = 85/15<br>Mw/Mn = 1.2 | MM-1<br>0.10 g | CL-9<br>0.10 g | I-1<br>0.07 g | D-1<br>0.003 g |
| 2 | (2) Mw = 5000<br>0.697 g<br>Mw/Mn = 1.15 | MM-2<br>0.20 g | CL-1<br>0.04 g | I-3<br>0.06 g | D-2<br>0.003 g |
| 3 | (1) Mw = 2500<br>0.656 g<br>Mw/Mn = 1.10 | MM-3<br>0.18 g | CL-4<br>0.08 g | II-1<br>0.08 g | D-3<br>0.004 g |
| 4 | (9) Mw = 8000<br>0.717 g<br>Mw/Mn = 1.5 | MM-4<br>0.05 g | CL-9<br>0.15 g | III-1<br>0.08 g | D-1<br>0.003 g |
| 5 | (27) Mw = 3500<br>0.696 g<br>x/y = 85/15<br>Mw/Mn = 1.2 | MM-5<br>0.05 g | CL-8<br>0.15 g | PAG3-21<br>0.10 g | D-3<br>0.004 g |
| 6 | (25) Mw = 5000<br>0.657 g<br>x/y = 70/30<br>Mw/Mn = 1.35 | MM-1<br>0.22 g | CL-5<br>0.05 g | PAG4-6<br>0.07 g | D-2<br>0.003 g |
| 7 | (31) Mw = 8000<br>0.616 g<br>x/y = 90/10<br>Mw/Mn = 1.1 | MM-4<br>0.15 g | CL-8<br>0.15 g | PAG4-28<br>0.08 g | D-2<br>0.004 g |
| 8 | (32) Mw = 7500<br>0.698 g<br>x/y = 90/10<br>Mw/Mn = 1.7 | MM-5<br>0.07 g | CL-9<br>0.18 g | PAG4-36<br>0.05 g | D-1<br>0.002 g |
| 9 | (93) Mw = 5000<br>0.690 g<br>x/y = 80/20<br>Mw/Mn = 1.65 | MM-1<br>0.20 g | CL-6<br>0.05 g | J-1<br>0.10 g | D-3<br>0.005 g |
| 10 | (95) Mw = 8000<br>0.656 g<br>x/y = 85/15<br>Mw/Mn = 1.3 | MM-2<br>0.20 g | C-3<br>0.05 g | J-9<br>0.09 g | D-2<br>0.004 g |
| 11 | (33) Mw = 8000<br>0.676 g<br>x/y = 85/15<br>Mw/Mn = 1.7 | MM-3<br>0.14 g | CL-8<br>0.10 g | J-17<br>0.08 g | D-2<br>0.004 g |
| 12 | (39) Mw = 15000<br>0.717 g<br>x/y = 90/10<br>Mw/Mn = 1.2 | MM-4<br>0.10 g | CL-8<br>0.10 g | J-22<br>0.08 g | D-1<br>0.003 g |
| Comparative Example | | | | | |
| 1 | (30) Mw = 9200<br>0.727 g<br>x/y = 85/15<br>Mw/Mn = 2.0 | MM-1<br>0.20 g | — | I-1<br>0.07 g | D-1<br>0.003 g |
| 2 | (31) Mw = 9200<br>0.727 g<br>x/y = 85/15<br>Mw/Mn = 2.0 | — | CL-9<br>0.20 g | I-1<br>0.07 g | D-1<br>0.003 g |

The symbols given to the nitrogen-containing basic compounds in Table 1 stand for the following compounds, respectively.

D-1: 1,5-Diazobicyclo [4.3.0] none-5-ene
D-2: 2,4,5-Triphenylimidazole
D-3: 4-Dimethylaminopyridine

TABLE 2

| | Sensitivity (μc/cm²) | Resolution (μm) | Pattern Profile Evaluation on 1-to-3 Scale | Line Edge Roughness (nm) |
|---|---|---|---|---|
| Example 1 | 6.0 | 0.11 | rectangular | 4.5 |
| Example 2 | 5.5 | 0.11 | rectangular | 4.8 |
| Example 3 | 4.8 | 0.11 | rectangular | 5.5 |
| Example 4 | 5.2 | 0.10 | rectangular | 5.0 |
| Example 5 | 5.5 | 0.11 | rectangular | 6.0 |
| Example 6 | 5.5 | 0.11 | somewhat taper | 4.5 |
| Example 7 | 5.5 | 0.09 | rectangular | 5.6 |
| Example 8 | 5.0 | 0.11 | rectangular | 6.2 |
| Example 9 | 4.9 | 0.10 | rectangular | 5.3 |
| Example 10 | 5.7 | 0.10 | rectangular | 6.1 |
| Example 11 | 5.3 | 0.10 | rectangular | 4.9 |
| Example 12 | 5.6 | 0.11 | rectangular | 5.4 |
| Comparative Example 1 | 6.5 | 0.14 | somewhat taper | 10.5 |
| Comparative Example 2 | 5.5 | 0.15 | somewhat taper | 13.8 |

<Patterning by X-Ray Irradiation>

Example 13 and Comparative Examples 3 and 4

Resist coatings were formed by using the same resist compositions as in Example 1, Comparative Example 1 and Comparative Example 2, respectively, in accordance with the same method as in Example 1. Then, each resist coating underwent the same patterning operations as in Example 1, except that the electron-beam drawing apparatus was replaced by a X-ray irradiation apparatus (gap value: 20 nm), and on the thus formed patterns were performed evaluations of resist properties (sensitivity, resolution, pattern profile and line edge roughness) according to the same methods as in Example 1.

The evaluation results are shown in Table 3.

TABLE 3

| | Sensitivity (mJ/cm²) | Resolution (μm) | Pattern Profile Evaluation on 1-to-3 Scale | Line Edge Roughness (nm) |
|---|---|---|---|---|
| Example 13 | 65 | 0.09 | rectangular | 6.3 |
| Comparative Example 3 | 90 | 0.15 | taper | 13.5 |
| Comparative Example 4 | 105 | 0.14 | taper | 12.0 |

As can be seen from the results shown in Tables 2 and 3, the present compositions are superior in sensitivity, resolution, pattern profile and line edge roughness to the comparative compositions, and it can be said that the present compositions have totally satisfactory resist properties.

The invention can provide a negative resist composition having high sensitivity, high resolution, excellent pattern profile and satisfactory line edge roughness.

The entire disclosure of each and every foreign patent application: Japanese Patent Application No.2002-238157, from which the benefit of foreign priority has been claimed in the present application is incorporated herein by reference, as if fully set forth.

What is claimed is:

1. A negative resist composition comprising:
   (A) an alkali-soluble resin;
   (B-1) a cross-linking agent capable of cross-linking with the alkali-soluble resin (A) by the action of an acid, in which the cross-linking agent is not a resin and is a phenol compound having a molecular weight of 2,000 or below and containing: at least one phenolic hydroxyl group; 3 to 5 benzene rings in the molecule; and at least two cross-linking groups bonded to any of the benzene rings, the cross-linking group being a group selected from the group consisting of a hydroxymethyl group, an alkoxymethyl group and an acyloxymethyl group;
   (B-2) a cross-linking agent capable of cross-linking with the alkali-soluble resin (A) by the action of an acid, in which the cross-linking agent contains at least two groups selected from the group consisting of the groups represented by the following formulae (1) and (2);
   (C) a compound capable of generating an acid upon irradiation with an actinic ray or radiation; and
   (D) a nitrogen-containing basic compound:

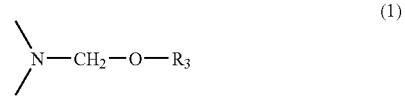

(1)

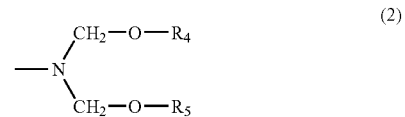

(2)

wherein $R_3$ represents a hydrogen atom, an alkyl group, or an alkylcarbonyl group; and $R_4$ and $R_5$ each represents a hydrogen atom, an alkyl group or an alkylcarbonyl group.

2. The negative resist composition as described in claim 1, wherein the alkali-soluble resin (A) contains a repeating unit represented by the following formula (3):

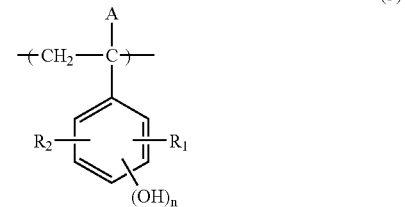

(3)

wherein A represents a hydrogen atom, an alkyl group, a halogen atom, or a cyano group; $R_1$ and $R_2$ each represents a hydrogen atom, a halogen atom, an alkyl group, an alkenyl group, a cycloalkyl group, an aryl group, an aralkyl group, an alkoxy group or an alkylcarbonyloxy group; and n represents an integer of 1 to 3.

3. The negative resist composition as described in claim 1, wherein the alkali-soluble resin (A) contains at least one repeating unit selected from the group consisting of the repeating units represented by the following formulae (4), (5) and (6):

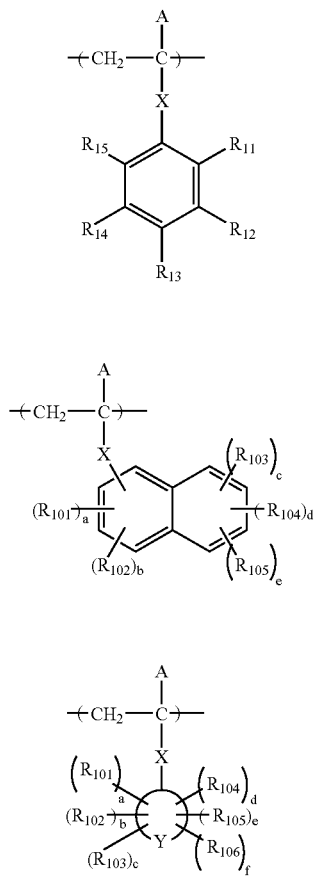

wherein

represents a group selected from the group consisting of the following structures:

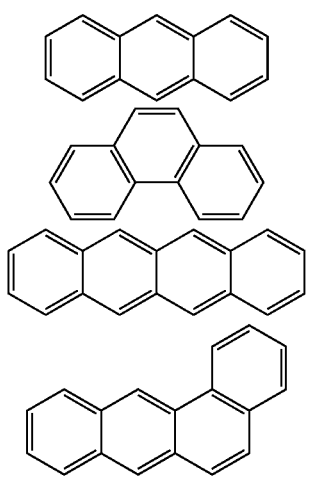

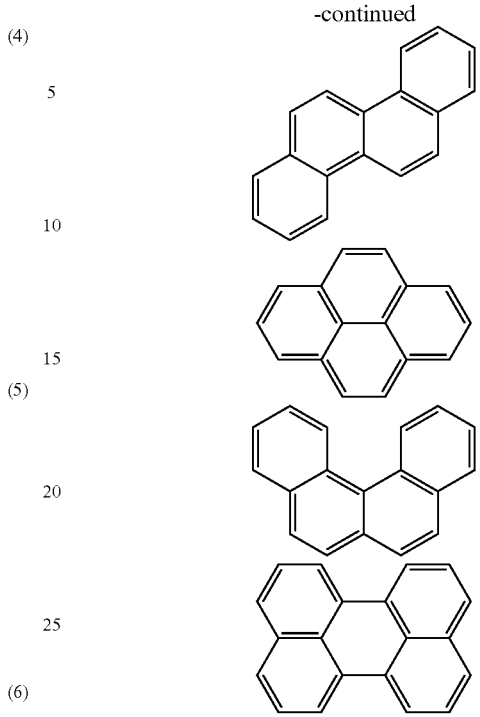

and

A represents a hydrogen atom, an alkyl group, a halogen atom, or a cyano group; X is a single bond, —COO—, —O—, or —CON($R_{16}$)—; $R_{16}$ represents a hydrogen atom, or an alkyl group; $R_{11}$ to $R_{15}$ each represents a hydrogen atom, a halogen atom, an alkyl group, an alkenyl group, a cycloalkyl group, an aryl group, an aralkyl group, an alkoxy group or an alkylcarbonyloxy group; $R_{101}$ to $R_{106}$ each represents a hydroxyl group, a halogen atom, an alkyl group, an alkoxy group, an alkylcarbonyloxy group, an alkylsulfonyloxy group, an alkenyl group, an aryl group, an aralkyl group, or a carboxyl group; and a to f each represents an integer of from 0 to 3.

4. The negative resist composition as described in claim 1, which further contains a surfactant.

5. The negative resist composition as described in claim 2, wherein the alkali-soluble resin (A) contains the repeating unit represented by the formula (3) in an amount of 50 to 100 mole %.

6. The negative resist composition as described in claim 3, wherein the alkali-soluble resin (A) contains at least one repeating unit selected from the group consisting of the repeating units represented by the formulae (4), (5) and (6) in an amount of 3 to 50 mole %.

7. The negative resist composition as described in claim 1, wherein the cross-linking agent (B-2) represents one of a compound or resin containing a melamine skeleton, a compound or resin containing a urea skeleton, a compound or resin containing an imidazolidine skeleton, and a compound or resin containing a glycoluril skeleton.

8. The negative resist composition as described in claim 1, which comprises the cross-linking agent (B-1) in a proportion of 0.5 to 50% by weight, to the total solid content in the negative resist composition.

9. The negative resist composition as described in claim 1, which comprises the cross-linking agent (B-2) in a proportion of 0.5 to 50% by weight, to the total solid content in the negative resist composition.

10. The negative resist composition as described in claim 1, wherein the ratio between the cross-linking agents (B-1) and (B-2) is from 3/97 to 97/3 by mole.

11. A method of forming a resist pattern, which comprises: forming a resist film including the negative resist composition described in claim 1; irradiating the resist film with an actinic ray or radiation; and developing the irradiated resist film.

12. The negative resist composition as described in claim 1, wherein the nitrogen-containing basic compound (D) includes a structure represented by one of the following formulae (A), (B), (C), (D) or (E), and in which formulae (B), (C), (D), or (E) each may be part of a cyclic structure:

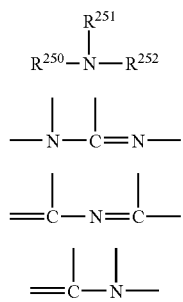

(A)
(B)
(C)
(D)

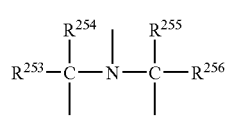

(E)

wherein $R^{250}$, $R^{251}$ and $R^{252}$, which may be the same or different, each represents a hydrogen atom, a 1-6C alkyl group, a 1-6C aminoalkyl group, a 1-6C hydroxyalkyl group, or a 6-20 C substituted or unsubstituted aryl group, and wherein $R^{251}$ and $R^{252}$ may combine to form a ring, and wherein $R^{253}$, $R^{254}$, $R^{255}$ and $R^{256}$ each represents a same or different 1-6C alkyl group.

13. The negative resist composition as described in claim 1, wherein the molar ratio of acid generator compound (C) to nitrogen-containing basic compound (D) is 2.5 to 300.

14. The negative resist composition as described in claim 1, wherein the molar ratio of acid generator compound (C) to nitrogen-containing basic compound (D) is 5.0 to 200.

15. The negative resist composition as described in claim 1, wherein the molar ratio of acid generator compound (C) to nitrogen-containing basic compound (D) is 7.0 to 150.

16. The negative resist composition as described in claim 1, wherein the molecular weight of the alkali-soluble resin (A), on weight average, is from 1,000 to 200,000.

17. The negative resist composition as described in claim 1, wherein the molecular weight of the alkali-soluble resin (A), on weight average, is from 2,000 to 50,000

\* \* \* \* \*